(12) United States Patent
Koshihara

(10) Patent No.: US 8,093,808 B2
(45) Date of Patent: Jan. 10, 2012

(54) ORGANIC EL DEVICE, METHOD OF MANUFACTURING ORGANIC EL DEVICE, AND ELECTRONIC DEVICE

(75) Inventor: Takeshi Koshihara, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 139 days.

(21) Appl. No.: 12/731,651

(22) Filed: Mar. 25, 2010

(65) Prior Publication Data
US 2010/0253222 A1    Oct. 7, 2010

(30) Foreign Application Priority Data

Apr. 1, 2009  (JP) .................................. 2009-088668

(51) Int. Cl.
  *H05B 33/00* (2006.01)
  *H01J 1/62* (2006.01)
(52) U.S. Cl. ........... 313/506; 445/23; 313/504; 313/110
(58) Field of Classification Search .......... 313/504–512, 313/110–112; 445/23–25
See application file for complete search history.

(56) References Cited

FOREIGN PATENT DOCUMENTS

JP  A-2006-339028  12/2006
JP  A-2007-220395  8/2007

*Primary Examiner* — Joseph L Williams
(74) *Attorney, Agent, or Firm* — Oliff & Berridge, PLC

(57) ABSTRACT

An organic EL device includes: a base body; pixels that are arranged in the base body and emit light beams having either of at least two different colors from among red, green and blue; a reflection layer that has optical reflectivity and arranged on the base body; an anti-reflection layer that is arranged on the reflection layer and has optical reflectivity lower than that of the reflection layer; an insulation layer that is arranged on the anti-reflection layer and has optical transmittance; a first electrode that is arranged in each pixel on the insulation layer and has optical transmittance; an organic functional layer that is arranged on the first electrode and includes at least a luminescent layer; a second electrode that is arranged on the organic functional layer and has optical reflectivity and optical transmittance; and an optical resonator that is formed between the reflection layer and the second electrode to resonate the light from the organic functional layer, wherein the optical resonator has a resonance wavelength corresponding to the color of the light emitted from the pixels in a first area out of an area of the pixels, and the anti-reflection layer is provided in an area except for the first area out of the area of the pixels.

12 Claims, 15 Drawing Sheets

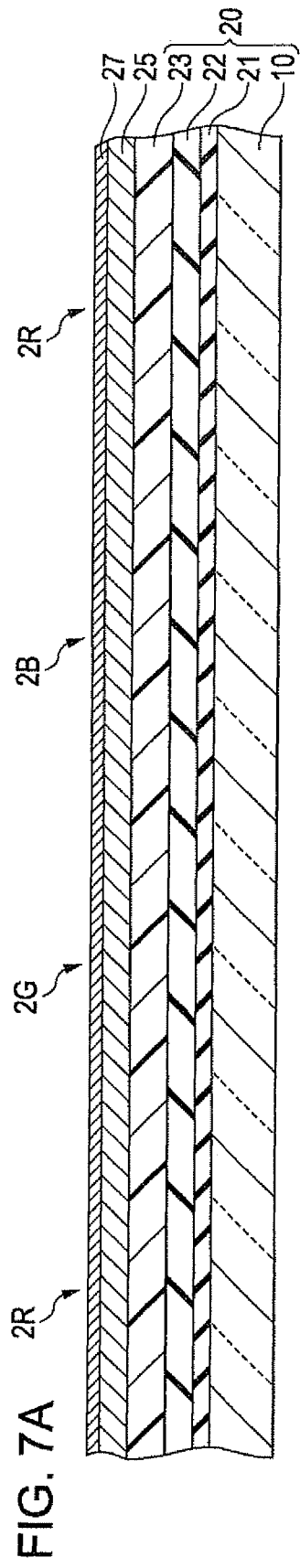
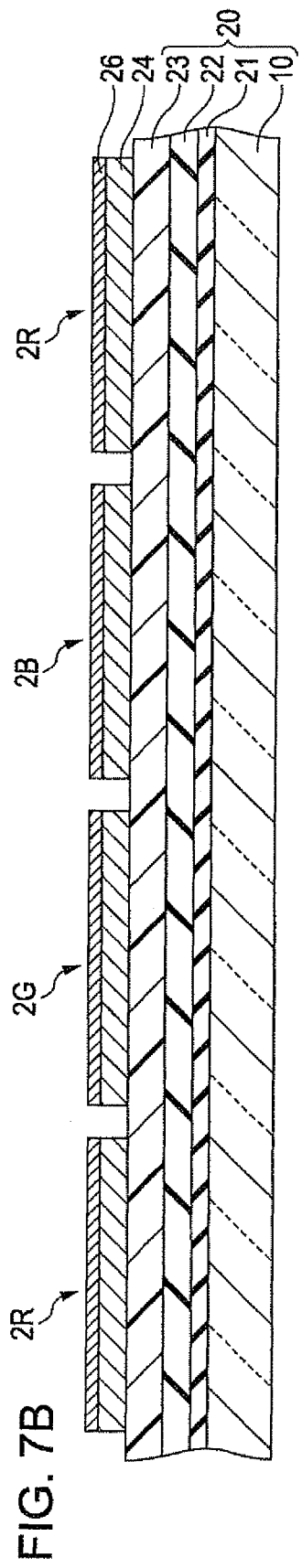
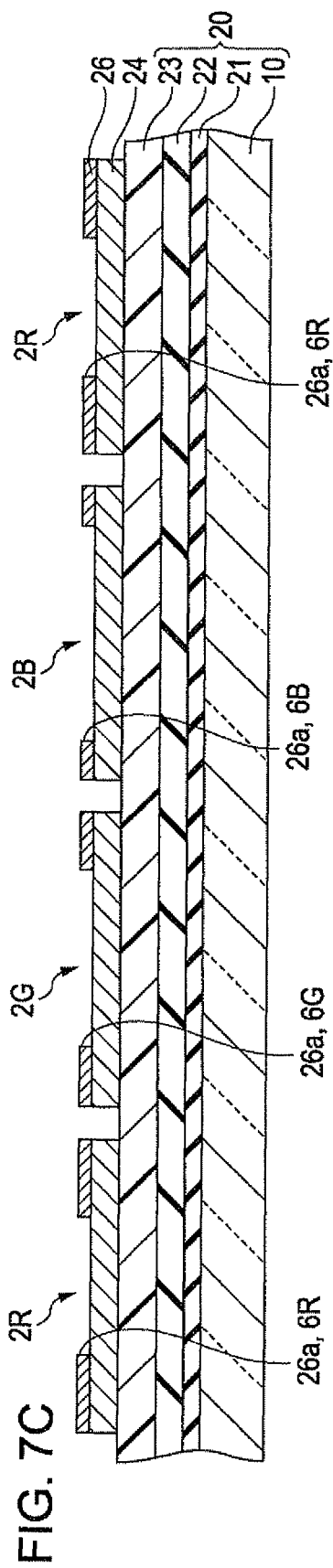

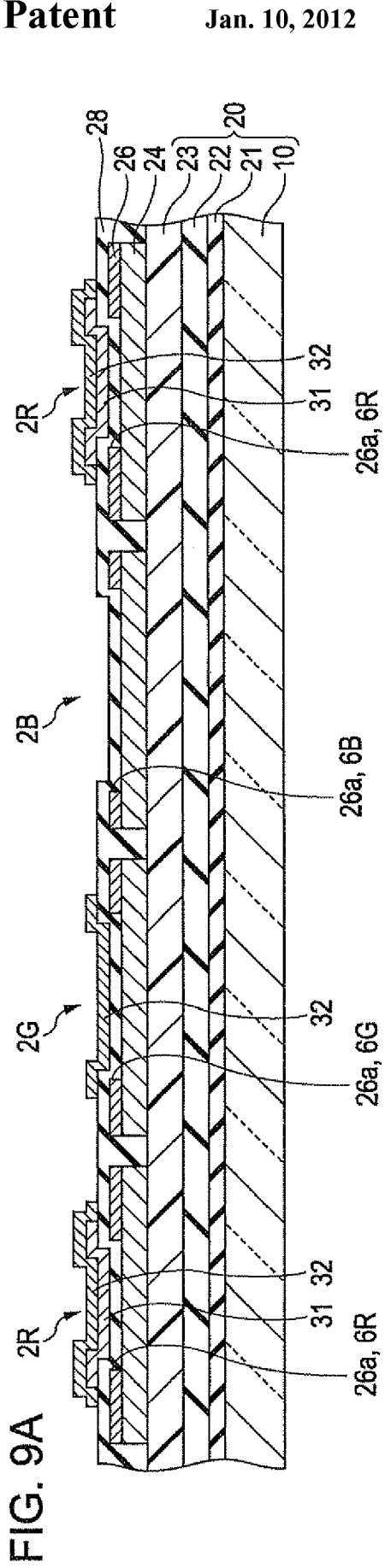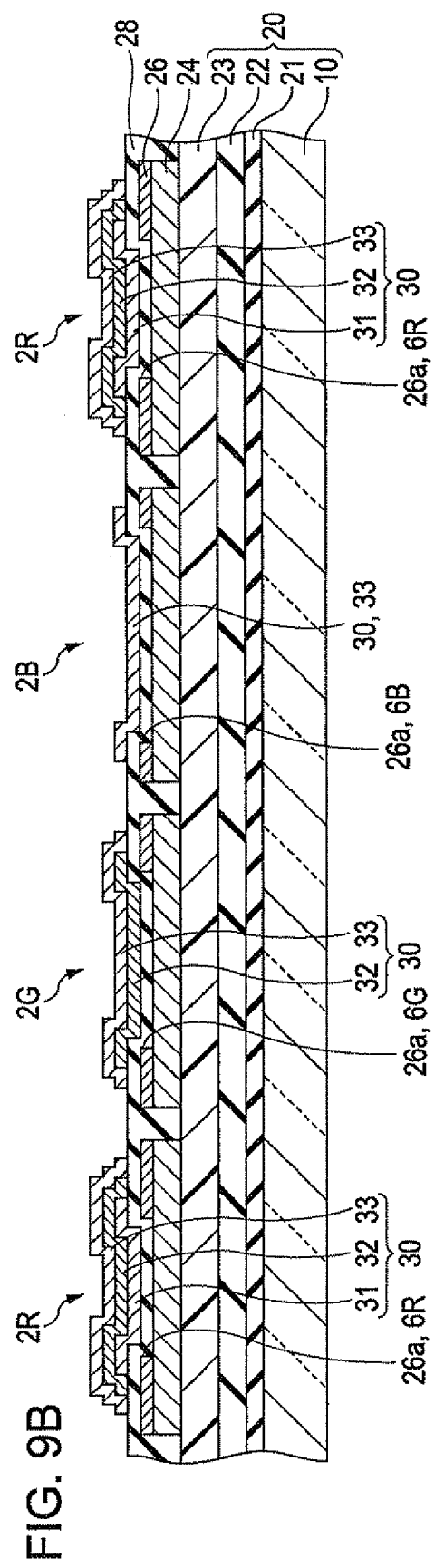

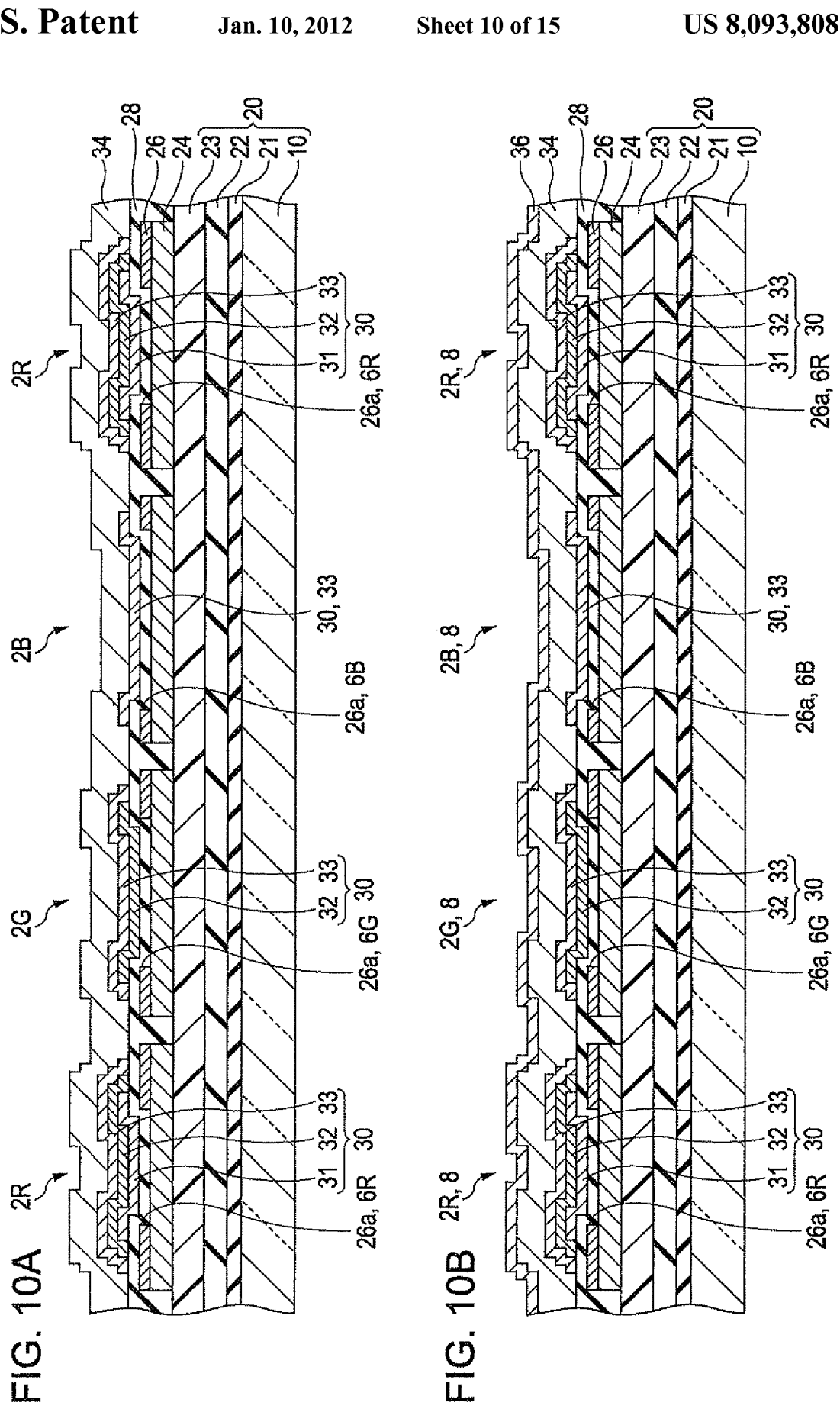

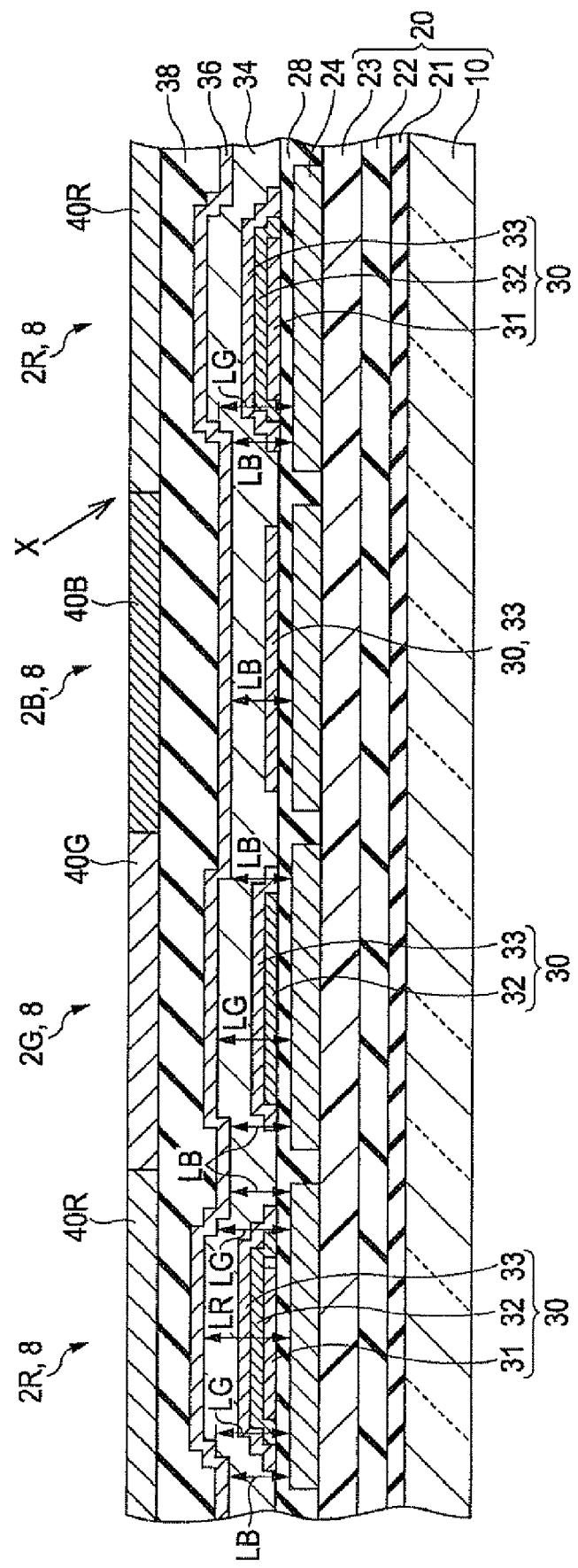

ORGANIC EL DEVICE, METHOD OF MANUFACTURING ORGANIC EL DEVICE, AND ELECTRONIC DEVICE

BACKGROUND

1. Technical Field

The present invention relates to an organic EL device, a method of manufacturing an organic EL device, and an electronic device.

2. Related Art

The organic electroluminescence device (hereinafter, referred to as an organic EL device) includes a stack of a positive electrode, an organic functional layer having at least a luminescent layer, and a negative electrode. For example, a top-emission type organic EL device is provided with a positive electrode or a reflection layer having optical reflectivity, so that the light generated from the luminescent layer is emitted to the negative electrode side.

In order to increase the luminance of the light emitted from the organic EL device, a method of amplifying and extracting the light having a resonance wavelength using an optical resonator for resonating the light from an organic functional layer included between a negative electrode and a reflection layer provided under a positive electrode has been proposed in JP-A-2006-339028 and JP-A-2007-220395.

In the method disclosed in JP-A-2006-339028, reflection layers corresponding to red, green, and blue colors RGB are formed in different layers, and insulation films are interposed therebetween. However, in such a structure, since the process of forming the reflection layer and the process of forming the insulation film are performed by three times for each R, G, and B colors, the number of manufacturing processes increases. In addition, since the reflection layer and the insulation film are arranged in three-layers between the positive electrode and the circuit portion, the contact hole may be lengthened so that risks such as bad connection may increase. On the other hand, in the method disclosed in the JP-A-2007-220395, the resonance wavelength of the optical resonator is adjusted by changing the layer thickness of the positive electrode according to the wavelengths of the colors R, G, and B. In such a configuration, it is possible to provide the reflection layer and the insulation film in a single layer.

However, in the method where the resonance wavelength of the optical resonator is adjusted by changing the layer thickness of the positive electrode, the layer thickness of the positive electrode is differentiated by combining, for example, three positive electrode layers. As a result, a portion where the layer thickness of the positive electrode is different is generated in a single area of the pixel. If the layer thickness of the positive electrode is different, the optical length of the optical resonator may change. Therefore, light beams of different resonance wavelengths may be mixed in a single area of the pixel. As a result, the luminance of the organic EL device may be degraded.

SUMMARY

The present invention has been made to address at least a part of the aforementioned problems, and may be realized by the following embodiments or applications.

Application 1

An organic EL device according to an application of the present invention includes: a base body; pixels that are arranged in the base body and emit light beams having either of at least two different colors; an reflection layer that has optical reflectivity and arranged on the base body; an anti-reflection layer that is arranged on the reflection layer and has optical reflectivity lower than that of the reflection layer; an insulation layer that is arranged on the anti-reflection layer and has optical transmittance; a first electrode that is arranged in each pixel on the insulation layer and has optical transmittance; an organic functional layer that is arranged on the first electrode and includes at least a luminescent layer; a second electrode that is arranged on the organic functional layer and has optical reflectivity and optical transmittance; and an optical resonator that is formed between the reflection layer and the second electrode to resonate the light from the organic functional layer, wherein the optical resonator has a resonance wavelength corresponding to a color of the light emitted from the pixels in a first area out of an area of the pixels, and the anti-reflection layer is provided in an area except for the first area out of the area of the pixels.

According to such a configuration, the anti-reflection layer is provided on the reflection layer in an area except for the first area, where the optical resonator has a resonance wavelength corresponding to a color of the light emitted from the pixels, out of the area of the pixels. In an area where the anti-reflection layer is provided on the reflection layer, since reflection of the light is suppressed, the light from the organic functional layer hardly resonates between the reflection layer and the second electrode in the area except for the first area. For this reason, it is possible to suppress degradation of the luminance caused when light beams having different resonance wavelengths are mixed in the area of the pixels. As a result, it is possible to provide an organic EL device having a higher luminance.

Application 2

In the organic EL device according to the aforementioned application, the layer thickness of the first electrode may be different in each pixel depending on the color of the light emitted from the pixel and may be the same at least in the first area.

According to such a configuration, since the layer thickness of the first electrode is set to be different depending on the color of the light emitted from the pixel and set to be the same in the first area, it is possible to adjust the resonance wavelength of the optical resonator.

Application 3

In the EL device according to the aforementioned applications, a driving element may be provided in each pixel on the base body. In addition, the first electrode may be conductively connected to the driving element in a second area different from the first area out of the area of the pixels, and the layer thickness of the first electrode in the second area may be the same as the layer thickness of the first electrode in the first area.

According to such a configuration, since the layer thickness of the first electrode is the same between the first area and the second area, it is possible to form the first electrode with the same layer thickness across the first to second areas. Consequently, it is possible to increase the area where the light having the resonance wavelength corresponding to the color of the light emitted from pixel can be obtained.

Application 4

In the EL device according to the aforementioned applications, the reflection layer may be arranged in each pixel.

According to such a configuration, it is possible to conductively connect the first electrode and the driving element with the reflection layer. Consequently, it is possible to improve freedom in selecting an arrangement position of the driving element in a design stage of the organic EL device.

Application 5

The EL device according to the aforementioned applications may further include a color filter that is arranged in each pixel on the second electrode and corresponds to the color of the light emitted from the pixel.

According to such a configuration, in the area where the anti-reflection layer is provided, even when light having a different wavelength from the resonance wavelength of the optical resonator is originated from the organic functional layer to the second electrode side, this light is not transmitted through the color filter. Consequently, it is possible to obtain high color purity.

Application 6

In the EL device according to the aforementioned applications, at least two different colors may include red, green, or blue.

According to such a configuration, it is possible to provide an organic EL device capable of full-color display using red light, green light, and blue light.

Application 7

The electronic device according to the present application includes the EL device according to the aforementioned applications.

According to such a configuration, since the electronic device has the aforementioned organic EL device, it is possible to provide an electronic device having a higher luminance in the display portion.

Application 8

According to an application of the present invention, there is provided a method of manufacturing an organic EL device having pixels that are arranged on a base body and emit light beams having either of at least two different colors, a reflection layer having optical reflectivity, a first electrode having optical transmittance, a second electrode having optical reflectivity and optical transmittance, an organic functional layer that is interposed between the first and second electrodes and includes at least a luminescent layer, and an optical resonator that is formed between the reflection layer and the second electrode to resonate the light from the organic functional layer, the method including: forming the reflection layer on the base body; forming, on the reflection layer, an anti-reflection layer having an optical reflectivity lower than that of the reflection layer; forming, on the anti-reflection layer, an insulation layer having optical transmittance; forming the first electrode in each pixel on the insulation layer; forming the organic functional layer on the first electrode; and forming the second electrode on the organic functional layer, wherein, in the process of forming the anti-reflection layer, the anti-reflection layer is formed in an area except for the first area out of the area of the pixels, and wherein, in the process of forming the first electrode, the first electrode is formed to have a different layer thickness in each pixel depending on a color of the light emitted from the pixel and at the same time have the same layer thickness at least in the first area.

According to such a method, it is possible to the adjust resonance wavelength of the optical resonator depending on the color of the light emitted from the pixel using the layer thickness of the first electrode. Since the first electrode is formed with the same layer thickness in at least the first area, when a portion where the layer thickness of the first electrode is different exists, that portion is arranged in the area where the anti-reflection layer is provided. Since the reflection of light is suppressed in the area where the anti-reflection layer is provided on the inflection layer, the light from the organic functional layer hardly resonates between the reflection layer and the second electrode in an area except for the first area.

For this reason, it is possible to suppress degradation of the luminance caused by mixing the light beams having different resonance wavelengths in the area of pixels. As a result, it is possible to manufacture an organic EL device having a higher luminance.

Application 9

In the method of manufacturing the organic EL device according to the aforementioned application, the base body may further include a driving element provided in each pixel. In addition, in the process of forming the first electrode, the first electrode may be conductively connected to the driving element in a second area different from the first area out of the area of the pixels. At the same time, the layer thickness of the first electrode in the second area may be the same as the layer thickness of the first electrode in the first area.

According to such a method, since the layer thickness of the first electrode is the same between the first and second areas, it is possible to form the first electrode having the same layer thickness across the first to second areas. Consequently, it is possible to increase the area capable of obtaining the light having the resonance wavelength corresponding to the color of the light emitted from the pixel.

Application 10

In the method of manufacturing the organic EL device according to the aforementioned applications, the reflection layer may be formed in each pixel in the process of forming the reflection layer.

According to such a method, it is possible to conductively connect the first electrode and the driving element with the reflection layer. Consequently, it is possible to improve freedom in selecting the arrangement position of the driving element in a design stage of the organic EL device.

Application 11

The method of manufacturing the organic EL device according to the aforementioned applications may further include forming, on the second electrode, a color filter corresponding to the color of the light emitted from the pixel after forming the second electrode.

According to such a method, in the area where the anti-reflection layer is provided, even when light having a different wavelength from the resonance wavelength of the optical resonator is originated from the organic functional layer to the second electrode side, this light is not transmitted through the color filter. Consequently, it is possible to obtain high color purity.

Application 12

In the method of manufacturing the organic EL device according to the aforementioned applications, at lest the two different colors may include red, green, or blue. According to such a method, it is possible to manufacture an organic EL device capable of full-color display using red light, green light, and blue light.

BRIEF DESCRIPTION OF THE DRAWINGS

The invention will be described with reference to the accompanying drawings, wherein like numbers reference like elements.

FIGS. 7A to 7C illustrate a method of manufacturing an organic EL device according to a first embodiment of the invention.

FIGS. 9A and 9B illustrate a method of manufacturing an organic EL device according to a first embodiment of the invention.

FIGS. 10A and 10B illustrate a method of manufacturing an organic EL device according to a first embodiment of the invention.

FIG. 15 is cross-sectional view schematically illustrating a configuration of an example of an organic EL device of the related art for comparison.

DESCRIPTION OF EXEMPLARY EMBODIMENTS

Hereinafter, embodiments of the invention will be described with reference to the accompanying drawings, where a film thickness or a ratio of dimensions may be appropriately changed in order to make it easier to describe the configuration. In addition, other elements that do not used for a description may be omitted.

First Embodiment

Organic EL Device

Figure 1:
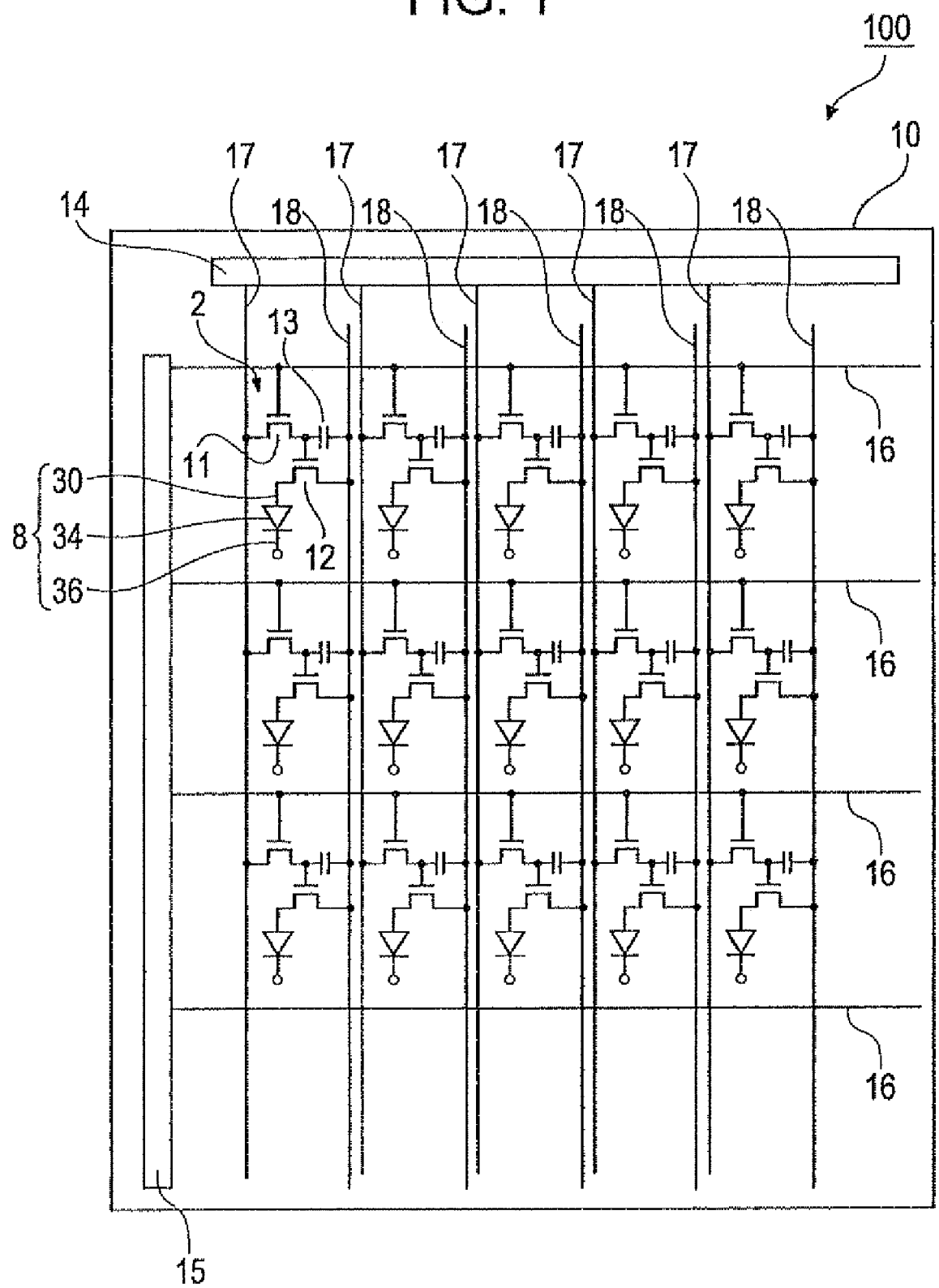
FIG. 1 is a block diagram illustrating an electric configuration of an organic EL device according to a first embodiment of the invention.
Figure 2:
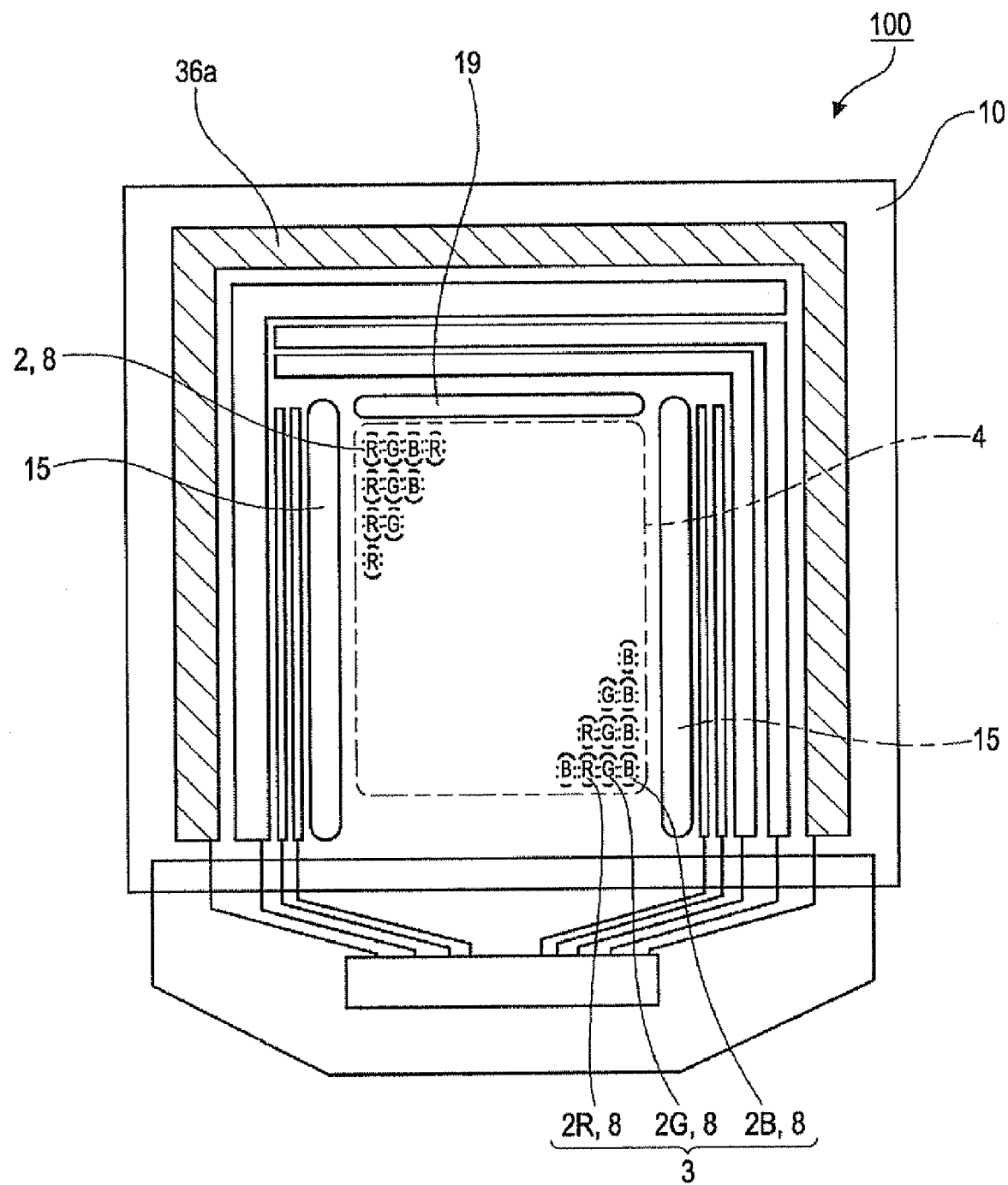
FIG. 2 is a plan view schematically illustrating an organic EL device according to a first embodiment of the invention.
Figure 3:
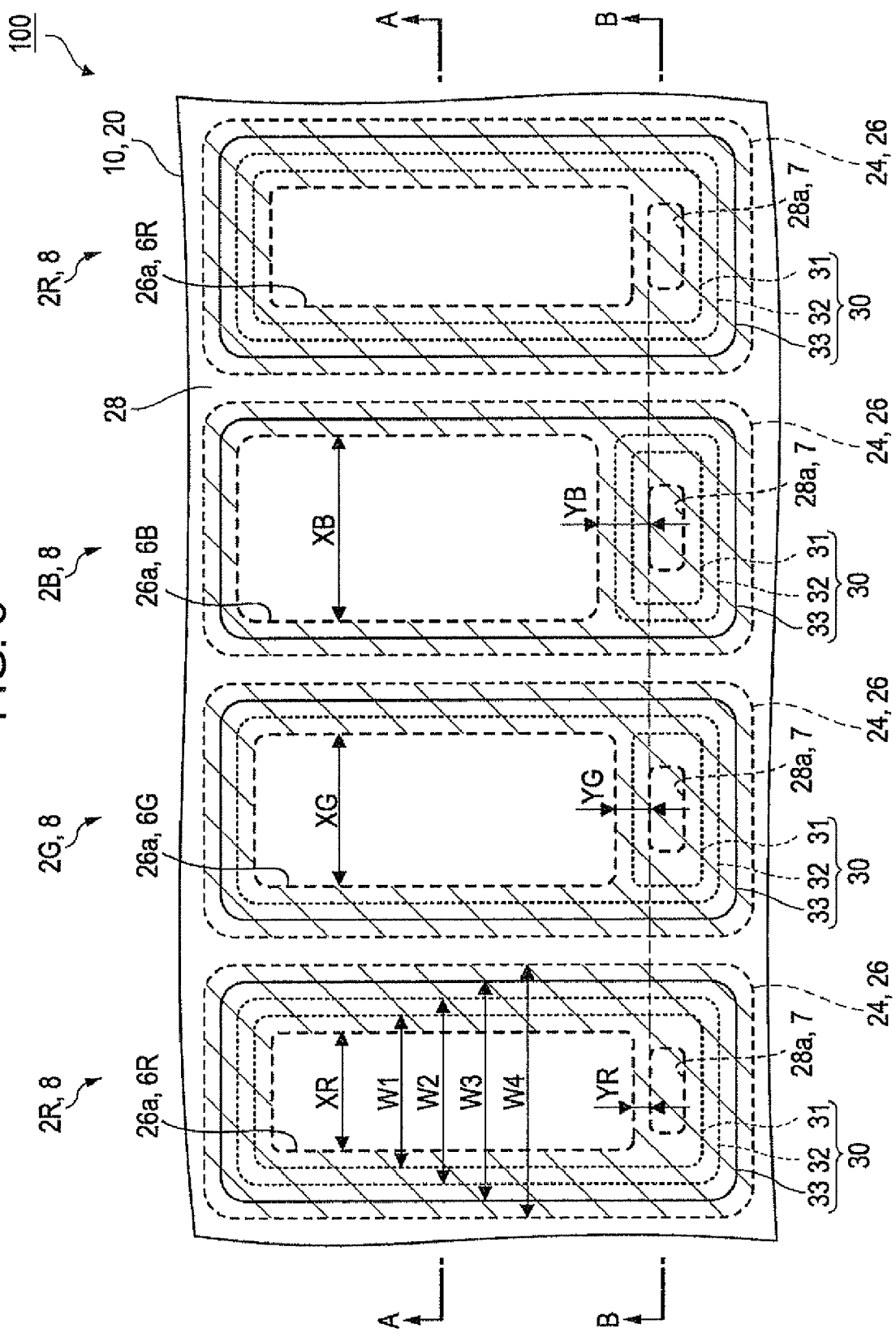
FIG. 3 is a plane view illustrating a configuration of a pixel of an organic EL device according to a first embodiment of the invention.
Figure 4:
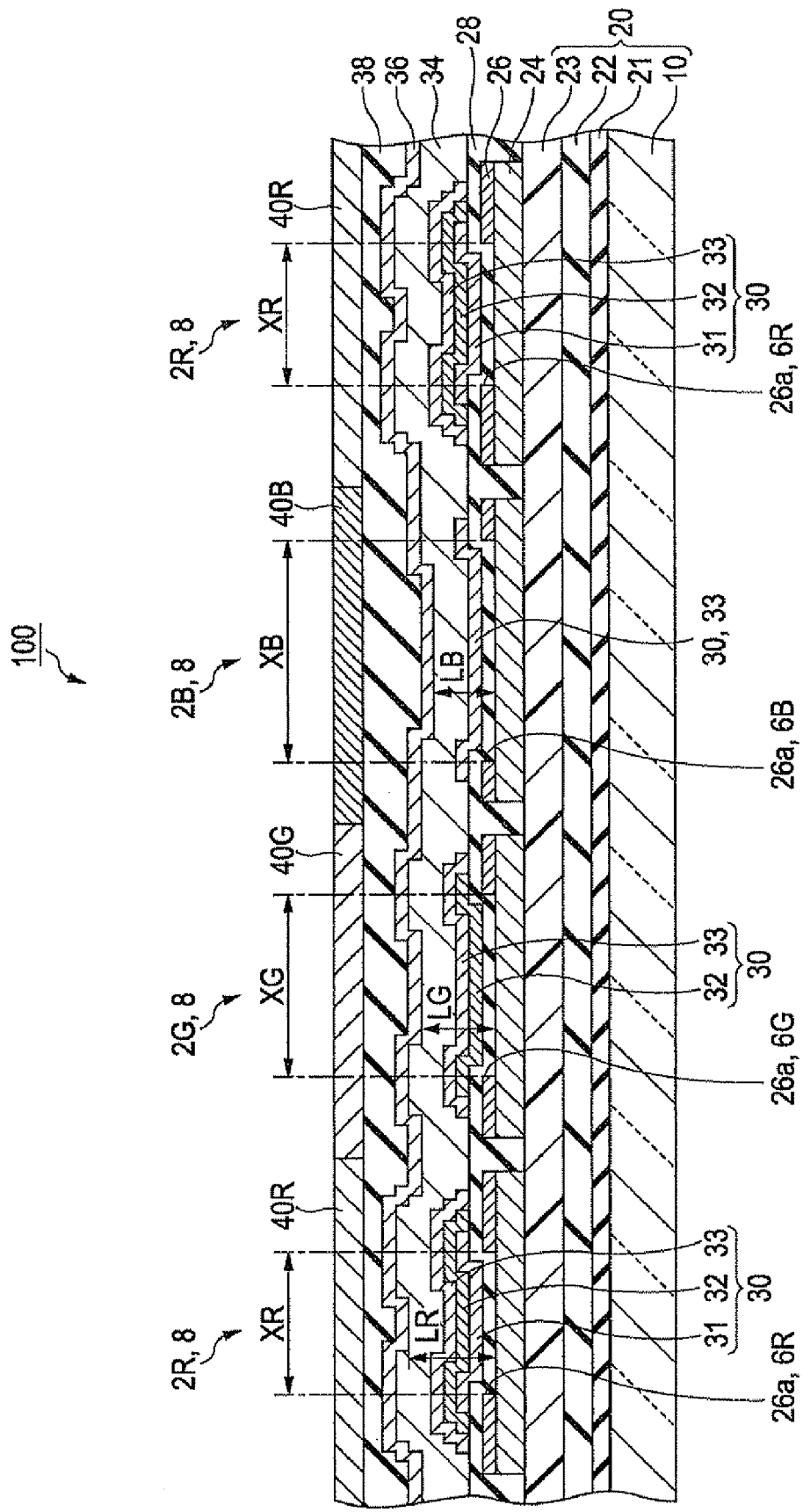
FIG. 4 is a cross-sectional view schematically illustrating a configuration of an organic EL device according to a first embodiment of the invention.
Figure 5:
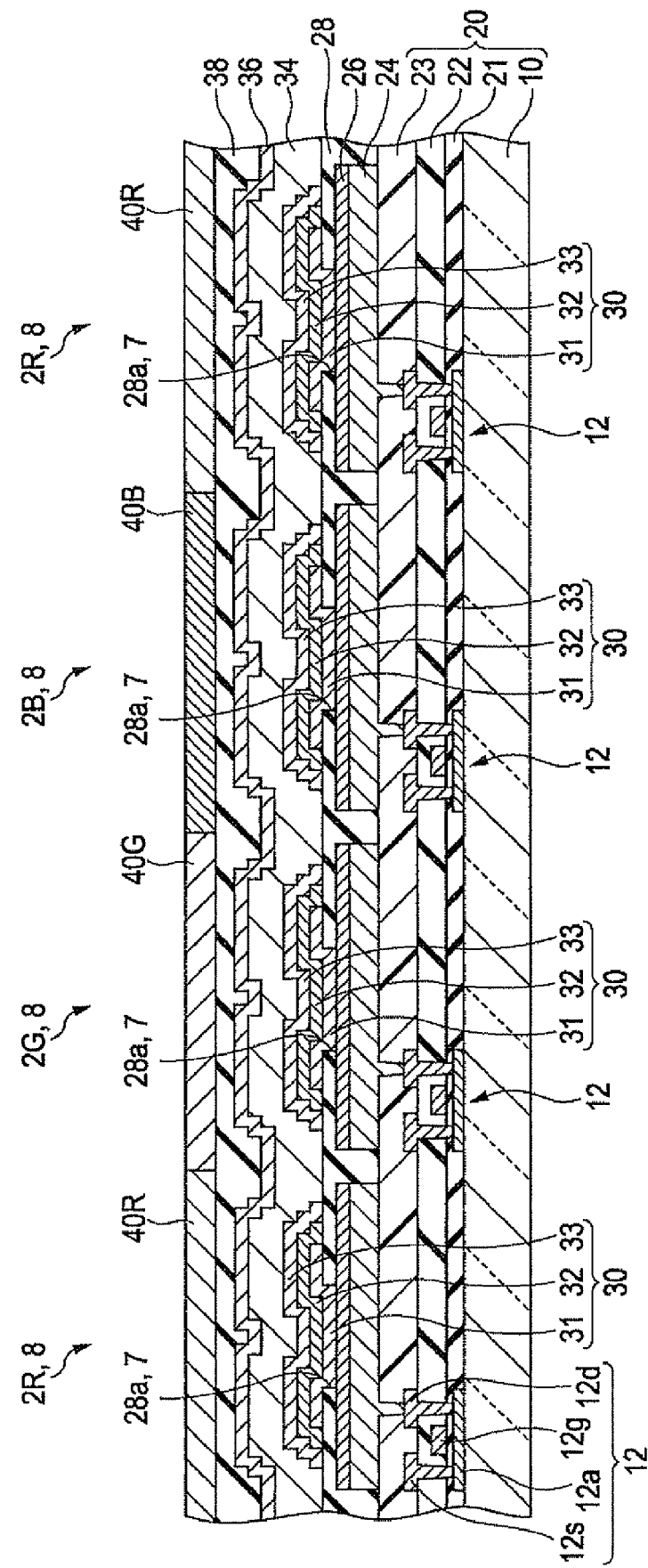
FIG. 5 is a cross-sectional view schematically illustrating a configuration of an organic EL device according to a first embodiment of the invention.

First, a configuration of an organic EL device according to first embodiment of the invention will be described with reference to the accompanying drawings. FIG. 1 is a block diagram illustrating an electric configuration of the organic EL device according to a first embodiment of the invention. FIG. 2 is a plan view schematically illustrating an organic EL device according to a first embodiment of the invention. FIG. 3 is a plan view illustrating a configuration of pixels of an organic EL device according to a first embodiment of the invention. Specifically, FIGS. 2 and 3 are plan views as seen from the color filter 40 side shown in FIG. 4. In FIG. 3, the organic functional layer 34, the negative electrode 36, the encapsulation layer 38, and the color filter 40 are omitted. FIGS. 4 and 5 are cross-sectional views schematically illustrating an organic EL device according to a first embodiment of the invention. Specifically, FIG. 4 is a cross-sectional view along a ling A-A of FIG. 3, and FIG. 5 is a partial cross-sectional view along a ling A-A of FIG. 3.

Referring to FIG. 1, the organic EL device 100 is an active matrix type organic EL device using a thin film transistor (hereinafter, referred to as a TFT) as a switching element.

The organic EL device 100 includes a substrate 10, a scanning line 16 provided on the substrate 10, a signal line 17 extending in a direction intersecting with the scanning line 16, and a power line 18 extending in parallel with the signal line 17. In the organic EL device 100, a pixel 2 is arranged in an area surrounded by the scanning line 16 and the signal line 17. For example, the pixel 2 is arranged in a matrix-shape along an extending direction of the scanning line 16 and an extending direction of the signal line 17.

In the pixel 2, there are provided a switching TFT 11, a driving TFT 12 as the driving element, a storage capacity 13, a positive electrode 30 as the first electrode, a negative electrode 36 as the second electrode, and an organic functional layer 34. Although not shown in the drawing, the organic functional layer 34 includes a hole transport layer, a luminescent layer, and an electron transport layer that are sequentially stacked. The positive electrode 30, the negative electrode 36, and the organic functional layer 34 constitute an organic electroluminescent element (i.e., an organic EL element) 8. In the organic EL element 8, holes injected from the hole transport layer and electrons injected from the electron transport layer are recombined in the luminescent layer so as to obtain luminescence.

A data line driving circuit 14 including a shirt register, a level shifter, a video line, and an analog switch is connected to the signal line 17. A scanning line driving circuit 15 including a shift register and a level shifter is connected to the scanning line 16.

In the organic EL device 100, if the scanning line 16 is driven to turn on the switching TFT 11, then the image signal supplied via the signal line 17 is stored in the storage capacitor 13, and the driving TFT 12 is turned on/off depending on the condition of the storage capacitor 13. When the power line 18 is electrically connected via the driving TFT 12, a driving current flows from the power line 18 to the positive electrode 30, so that the current further flows to the negative electrode 36 through the organic functional layer 34. The luminescent layer of the organic functional layer 34 emits light with a luminance corresponding to the current amount flowing between the positive electrode 30 and the negative electrode 36.

Next, a schematic configuration of an organic EL device 100 will be described. Referring to FIG. 2, the organic EL device 100 has a luminescent area 4 having a generally rectangular shape on the substrate 10. The luminescent area 4 is an area substantially contributing to the luminescence in the organic EL device 100. The organic EL device 100 may have a dummy area that does not substantially contribute to the luminescence around the luminescent area 4.

In the luminescent area 4, pixels 2 emitting any light beam of a red, green, or blue color are arranged, for example, in a lattice shape. Around the luminescent area 4, two scanning line driving circuits 15 and an inspection circuit 19 are disposed. The inspection circuit 19 is a circuit for inspecting an operation state of the organic EL device 100. In the outer periphery of the substrate 10, a negative electrode wire 36a is provided.

The pixel 2 is a minimum unit for display in organic EL device 100, and includes a pixel 2R emitting red light R, a pixel 2G emitting green light G, and a pixel 2B emitting blue light B (hereinafter, also referred to as just a pixel 2 unless the corresponding color is particularly specified). The organic EL device 100 has the organic EL element 8 in each pixel 2. In the organic EL device 100, a pixel group 3 is constructed of pixels 2R, 2G, and 2B, and various colors can be displayed by suitably changing the luminance of each pixel 2R, 2G, and 2B in each pixel group 3.

Referring to FIG. 3, the pixel 2 has, for example, a generally rectangular shape having four rounded corners as seen from the top. The pixel 2 has a long side and a short side. The breadthwise direction of the pixel 2 is an extending direction of the scanning line 16 (refer to FIG. 1). In addition, the lengthwise direction of the pixel 2 is an extending direction of the scanning line 16 (refer to FIG. 1). In each pixel 2, the positive electrode 30 is provided. The area of the pixel 2 is an area where the luminescence can be obtained by the organic EL element 8 and is defined by a contour of the positive electrode 30. The pixel 2 has a display portion 6 as the first area and a contact portion 7 as the second area.

In each pixel 2, the reflection layer 24 and the anti-reflection layer 26 are provided. In FIG. 3, the anti-reflection layer 26 is hatched for easy understanding. The anti-reflection layer 26 has an opening 26a. An area overlapped with the opening 26a as seen in a plan view is the display portion 6. The display portion 6 is an area substantially contributing to display within the pixel 2. In the display portion 6, the light originating from the organic functional layer 34 is reflected by the reflection layer 24 and emitted to the color filter 40 (refer to FIG. 4).

The organic EL device 100 includes display portions 6R, 6G, and 6B corresponding to the pixels 2R, 2G, and 2B (hereinafter, also referred to just as a display portion 6 unless the corresponding color is particularly specified). The opening 26a has a different size in each pixel 2. Therefore, the display portions 6R, 6G, and 6B have different sizes. The line A-A of FIG. 3 is depicted to traverse the display portions 6R, 6G, and 6B along the short side of the pixel 2.

On the anti-reflection layer 26, the insulation layer 28 is provided. The insulation layer 28 has openings 28a in each pixel 2. An area overlapped with the opening 28a as seen in a plan view is the contact portion 7. The contact portion 7 is arranged in a position corresponding to the driving TFT 12 (refer to FIG. 15). In the contact portion 7 (opening 28a), the positive electrode 30 overlying the insulation layer 28 is conductively connected to the anti-reflection layer 26.

The size of the opening 28a is that same as the pixel 2R, 2G, or 2B, and thus, the size of the contact portion 7 is the same as the pixel 2R, 2G, or 2B. The contact portion 7 is located, for example, in one end in the lengthwise direction of the pixel 2. The line B-B of FIG. 3 is located to traverse the contact portion 7 along the short side of the pixel 2. In addition, the location of the contact portion 7 is not limited thereto, but may be located, for example, in the center of the pixel 2 corresponding to the location of the driving TFT 12.

As shown in FIG. 5, the organic EL device 100 includes, on the substrate 10, a driving TFT 12, an interlayer insulation layer 22, a planarization layer 23, a reflection layer 24, an anti-reflection layer 26, and insulation layer 28, a positive electrode 30, an organic functional layer 34, a negative electrode 36, an encapsulation layer 38, and a color filter 40. The organic EL device 100 is a top emission type in which the light originating from the organic functional layer 34 is emitted to the color filter 40 side. In addition, the organic EL device 100 has an optical resonator that amplifies and extracts the light having a resonance wavelength between the reflection layer 24 and the negative electrode 36.

Since the organic EL device 100 is a top emission type, the substrate 10 may be formed of either a translucent material or an opaque material. For example, the translucent material may include glass, quartz, resin (plastic or a plastic film), or the like. For example, the opaque material may include ceramics such as alumina, a material obtained by executing an insulation process such as surface oxidation on a metal sheet such as stainless steel, thermoplastic or thermosetting resin, a film thereof (e.g., a plastic film), or the like. The substrate 10 may be covered with a protection layer formed of, for example, silicon oxide ($SiO_2$).

The driving TFT 12 is provided in a position corresponding to the pixel 2 on the substrate 10. The driving TFT 12 includes a semiconductor film 12a, a gate insulation layer 21, a gate electrode 12g, a drain electrode 12d, and a source electrode 12s. The semiconductor film 12a includes a source region, a drain region, and a channel region. The semiconductor film 12a is covered with the gate insulation layer 21. The gate electrode 12g is positioned to overlap the channel region of the semiconductor film 12a as seen in a plan view with the gate insulation layer 21 being interposed therebetween.

The interlayer insulation layer 22 covers the gate electrode 12g and the gate insulation layer 21. The drain electrode 12d is conductively connected to the drain region of the semiconductor film 12a via the contact hole provided in the interlayer insulation layer 22. Similarly, source electrode 12s is conductively connected to the source region of the semiconductor film 12a via the contact hole.

The planarization layer 23 covers the interlayer insulation layer 22, the drain electrode 12d, and the source electrode 12s. The planarization layer 23 has a nearly flat surface obtained by alleviating protrusions of the drain electrode 12d, the source electrode 12s, or other wires portions. The planarization layer 23 is formed of, for example, acrylic resin. Hereinafter, the substrate 10, the driving TFT 12 formed on the substrate 10, the interlayer insulation layer 22, and the planarization layer 23 are collectively referred to as a base body 20.

On the base body 20, a reflection layer 24 having optical reflectivity is provided in each pixel 2. The reflection layer 24 reflects the light originating from the organic functional layer 34 and emits it to the color filter 40 side. Therefore, the reflection layer 24 preferably has a high optical reflectivity so that the light having a high luminance can be emitted from the pixel 2R, 2G, or 2B. The reflection layer 24 is formed of, for example, aluminum. A material of the reflection layer 24 may include alloy containing aluminum or alloy containing silver.

The reflection layer 24 is conductively connected to the drain electrode 12d via the contact hole provided in the planarization layer 23. Although not shown in the drawing, a conductive layer formed on titanium (Ti) or titanium nitride (TiN) is provided on the surface conductively connected to the drain electrode 12d of the reflection layer 24. The surface of the reflection layer 24 is protected by this conductive layer when the reflection layer 24 is conductively connected to the drain electrode 12d. At the same time, conductivity with the drain electrode 12d is improved by this conductive layer.

On the reflection layer 24, the anti-reflection layer 26 having optical reflectivity lower than that of the reflection layer 24 is provided. The anti-reflection layer 26 has a function of suppressing reflection of the light originating from the organic functional layer 34 in the reflection layer 24. Preferably, the reflectivity of the anti-reflection layer 26 is equal to or less than 20%, more equal to or less than preferably, 10%. The anti-reflection layer 26 is conductively connected to the reflection layer 24 and the positive electrode 30 at the same time. That is, the reflection layer 24 and the positive electrode 30 are conductively connected via the anti-reflection layer 26.

The anti-reflection layer 26 protects the surface of the reflection layer 24 when the reflection layer 24 and the positive electrode 30 are conductively connected. In addition, the anti-reflection layer 26 improves conductivity with the positive electrode 30. The anti-reflection layer 26 is formed of, for example, TiN. A material of the anti-reflection layer 26 may include a material having optical reflectivity lower than that of the reflection layer 24, preferably, a material having a low optical reflectivity as much as the aforementioned reflectivity, or may include other materials than TiN if it is conductive. The anti-reflection layer 26 has an opening 26a (refer to FIG. 4).

The insulation layer 28 is provided to cover the base body 20, the reflection layer 24, and the anti-reflection layer 26. The insulation layer 28 has optical transmittance. The insulation layer 28 has optical transmittance. The insulation layer 28 protects the reflection layer 24 and the anti-reflection layer 26 when positive electrode 30 is formed. The insulation layer 28 is formed of, for example, silicon nitride (SiN). A material of the insulation layer 28 may include $SiO_2$ or silicon oxynitride (SION). The layer thickness of the insulation layer 28 is, for example, 50 nm. The insulation layer 28 has an opening 28a in each pixel 2.

The positive electrode 30 is provided on the insulation layer 28. The positive electrode 30 is conductively connected to the anti-reflection layer 26 in the opening 28a (the contact portion 7). Therefore, the positive electrode 30 is conductively connected to the drain electrode 12d of the driving TFT 12 via the anti-reflection layer 26.

Since the organic EL device 100 is a top emission type, the driving TFT 12 can be disposed even in the area of the pixel 2 if it is overlapped with the reflection layer 24 as seen in a plan view. Consequently, it is possible improve freedom in selecting the location of the driving TFT 12 in a design stage of the organic EL device 100.

The positive electrode 30 is configured by combining the first positive electrode layer 31, the second positive electrode layer 32, and the third positive electrode layer 33. In the contact portion 7 shown in FIG. 5, all of the pixels 2R, 2G, and 2B are formed by sequentially stacking the first positive electrode layer 31, the second positive electrode layer 32, and the third positive electrode layer 33 from the base body 20 side. In this manner, the positive electrode 30 includes three positive electrode layers in the contact portion 7 in order to protect the anti-reflection layer 26 underlying the positive electrode 30 in a patterning process when the positive electrode 30 is formed during the positive electrode forming process S50 which will be described later.

Meanwhile, in the display portions 6R, 6G, and 6B shown in FIG. 4, the configuration of the positive electrode 30 is different among the pixels 2R, 2G, and 2B. In the pixel 2R, the positive electrode 30 is constructed by sequentially stacking the first positive electrode layer 31, the second positive electrode layer 32, and the third positive electrode layer 33 on the insulation layer 28. In the pixel 2G, the positive electrode 30 is constructed by sequentially stacking the second positive electrode layer 32 and the third positive electrode layer 33 on the insulation layer 28. In the pixel 2B, the positive electrode 30 is constructed by forming the third positive electrode layer 33 on the insulation layer 28.

Therefore, the layer thickness of the positive electrode 30 is different in the display portions 6R, 6G, and 6B. The display portion 6G is thicker than the display portion 6B as much as the layer thickness of the second positive electrode layer 32. The display portion 6R is thicker than the display portion 6G as much as the layer thickness of the first positive electrode layer 31. In this manner, by differentiating the layer thickness of the positive electrode 30 in the display portions 6R, 6G, and 6B, it is possible to adjust the wavelength of the optical resonator depending on the color of the light emitted from the pixels 2R, 2G, and 2B.

The first positive electrode layer 31, the second positive electrode layer 32, and the third positive electrode layer 33 have the optical transmittance. The first positive electrode layer 31, the second positive electrode layer 32, and the third positive electrode layer 33 are formed of, for example, polycrystalline ITO (Indium Tin Oxide). A total layer thickness of the first positive electrode layer 31, the second positive electrode layer 32, and the third positive electrode layer 33 is set to, for example, approximately 120 to 130 nm. Each layer thickness of the first positive electrode layer 31, the second positive electrode layer 32, and the third positive electrode layer 33 is appropriately set depending on the resonance wavelength of the optical resonator.

Returning to FIG. 3, out of the positive electrode 30, the second positive electrode layer 32 is formed to be smaller than the third positive electrode layer 33, and the first positive electrode layer 31 is formed to be smaller than the second positive electrode layer 32. Therefore, within the area of the pixel 2, there are a portion obtained by stacking the first positive electrode layer 31, the second positive electrode layer 32, and the third positive electrode layer 33, a portion obtained by stacking the second positive electrode layer 32 and the third positive electrode layer 33, and a portion corresponding to only the third positive electrode layer 33. According to such a configuration, the positive electrode 30 has a step-like cross-section in the periphery of the positive electrode 30 (refer to FIGS. 4 and 5).

The positive electrode 30 has a step-like cross-section in order to prevent the underlying positive electrode layer formed in advance from being damaged when the overlying positive electrode layer is patterned, by forming the overlying positive electrode layer larger than the underlying positive electrode layer during the process of forming the positive electrode 30. This also prevents unevenness in the organic functional layer 34 overlying the positive electrode 30 from increasing.

Preferably, the reflection layer 24 and the anti-reflection layer 26 are larger than the positive electrode 30 as seen in a plan view. Since the reflection layer 24 and the anti-reflection layer 26 are larger than the positive electrode 30, it is possible to arrange the positive electrode 30 in a location overlapped with the reflection layer 24 and the anti-reflection layer 26 as seen in a plan view even when the location is deviated from the positive electrode 30. The length W4 (i.e., the width in the lengthwise direction of pixel 2) of the short side in the reflection layer 24 and the anti-reflection layer 26 is set to, for example, approximately 10 μm. The lengths W1, W2, and W3 (i.e., the widths of the lengthwise direction of the pixel 2) of the short sides of the first positive electrode layer 31, the second positive electrode layer 32, and the third positive electrode layer 33 are set to, for example, 9 μm, 8 μm, and 7 μm, respectively.

The length of the short side of the display portion 6 (the opening 26a) (i.e., the width of the lengthwise direction of the pixel 2) is different from that of the display portion 6R, 6G, or 6B. The length XR of the short side of the display portion 6R is equal to or smaller than the length W1 of the short side of the first positive electrode layer 31. The length XG of the short side of the display portion 6G is equal to or smaller than the length W2 of the short side of the second positive electrode layer 32. The length XB of the short side of the display portion 6B is equal to or smaller than the length W3 of the short side of the third positive electrode layer 33.

Therefore, the layer thickness of the positive electrode 30 is the same in at least each of the display portions 6R, 6G, and 6B (or the opening 26a). Accordingly, the resonance wavelengths of the optical resonators in the display portions 6R, 6G, and 6B are the same as the wavelengths of the light emitted from the pixels 2R, 2G, and 2B, respectively.

The area except for the display portions 6R, 6G, and 6B in the pixels 2R, 2G, and 2B has a step-like cross-section having a different layer thickness of the positive electrode 30. Therefore, in a part of the area except for the display portions 6R, 6G, and 6B, the resonance wavelength of the optical resonator is different from the wavelength of the light emitted from each of the pixels 2R, 2G, and 2B. In other words, out of the area of the pixel 2, the anti-reflection layer 26 is provided in an area where the resonance wavelength of the optical resonator is different from the wavelength corresponding to the color of the light emitted from the pixel 2.

Next, focusing on the lengthwise direction of the pixel 2, in the pixel 2R, the positive electrode 30 includes first positive electrode layer 31, the second positive electrode layer 32, and the third positive electrode layer 33 across the display portion 6R and the contact portion 7. Therefore, the positive electrode 30 has the same thickness in the display portion 6R and contact portion 7.

In the pixel 2G, the positive electrode 30 includes the second positive electrode layer 32 and the third positive electrode layer 33 in the display portion 6G, and the first positive electrode layer 31, the second positive electrode layer 32, and the third positive electrode layer 33 the contact portion 7. Therefore, the positive electrode 30 has a different layer thickness between the display portion 6G and the contact portion 7, and unevenness corresponding to the layer thickness of the first positive electrode layer 31 exists in an area between the display portion 6G and the contact portion 7.

In the pixel 2B, the positive electrode 30 includes the third positive electrode layer 33 in the display portion GB, and the first positive electrode layer 31, the second positive electrode layer 32, and the third positive electrode layer 33 the contact portion 7. Therefore, the positive electrode 30 has a different layer thickness between the display portion 6B and the contact portion 7, and unevenness corresponding to the layer thicknesses of the first positive electrode layer 31 and the second positive electrode layer 32 exists in an area between the display portion GB and the contact portion 7.

The anti-reflection layer 26 is overlapped with an area where the layer thickness of the positive electrode 30 is different and has unevenness as seen in a plan view. For this reason, the gap YG between the display portion 6G and contact portion 7 in the pixel 2G becomes larger than the gap YR between the display portion 6R and the contact portion 7 in the pixel 2R. In addition, the gap YB between the display portion GB and the contact portion 7 in the pixel 2B becomes larger than the gap YG between the display portion 6G and the contact portion 7 in the pixel 2G.

Next, referring to FIG. 4, the organic functional layer 34 is provided on the positive electrode 30. The organic functional layer 34 includes the hole transport layer, the luminescent layer, and the electron transport layer that are sequentially stacked. The hole transport layer is formed of, for example, triphenylamine derivatives (TPD), pyrazoline derivatives, arylamine derivatives, stilbene derivatives, triphenyldiamine derivative, or the like. The luminescent layer is formed of, for example, aluminum quinolinol complex (Alq3) as a host material and rubrene or the like as an impurity. The electron transport layer is formed of, for example, Alq3 or the like.

In the organic functional layer 34, luminescence can be obtained in the area of the pixel 2 by recombining holes injected from the hole transport layer and electrons injected from the electron transport layer. The organic EL device 100 has the organic functional layer 34 which emits light of a common color in the pixels 2R, 2G, and 2B. The luminescent color of the organic functional layer 34 is, for example, white.

The layer thickness of the organic functional layer 34 is, for example, 150 nm.

The organic EL device 100 has the optical resonator where the light originating from the organic functional layer 34 resonates. Accordingly, even when the luminescent color of the organic functional layer 34 is white, it is possible to emit the light of three different colors R, G, and B. Since the organic EL device 100 has the optical resonator, it is possible to commonly use a white luminescent material in the pixels 2R, 2G, and 2B as a luminescent material of the organic functional layer 34.

The negative electrode 36 is provided to cover the organic functional layer 34. The negative electrode 36 has optical transmittance and optical reflectivity. That is, the negative electrode 36 has a semi-translucent and semi-reflective half-mirror configuration. The negative electrode 36 is formed of, for example, alloy of magnesium and silver (Mg—Ag alloy). A material of the negative electrode 36 may include calcium, natrium lithium, or a metal compound of them.

The encapsulation layer 38 is provided to cover the negative electrode 36. The encapsulation layer 38 functions as a gas barrier layer for preventing degradation of the organic EL element 8 caused by penetration of oxygen or water. The encapsulation layer 38 is formed of, for example, SiON. A material of the encapsulation layer 38 may include $SiO_2$ or SiN. In addition, a planarization layer formed of acrylic resin or the like may be provided on the encapsulation layer 38.

The color filter 40 is provided on the encapsulation layer 38. The color filter 40 includes a color filter 40R corresponding to the light of red color R, a color filter 40G corresponding to the light of green color G, and a color filter 408 corresponding to the light of blue color B. The color filters 40R, 40G, and 40B corresponding to the pixels 2R, 2G, 2B, respectively, are provided to overlap with the organic EL element 8 as seen in a plan view.

In addition, the neighboring color filters 40R, 40G, and 40B may be separated, or a light shielding layer may be provided between the neighboring color filters 40R, 40G, and 408. A protection layer may be provided to cover the neighboring color filters 40R, 40G, and 408.

In addition, the organic EL device 100 does not have a barrier wall. Since there is no barrier wall, it is possible to reduce the size or thickness of the organic EL device 100.

Optical Resonator

The organic EL device 100 has the optical resonator where the light originating from the organic functional layer 34 resonates between the reflection layer 24 and the negative electrode 36. The light originating from the organic functional layer 34 travels between the reflection layer 24 and the negative electrode 36 in a round trip so that the light of having a resonance wavelength corresponding to the optical length L is amplified and output to the negative electrode 36 side. Therefore, it is possible to increase the luminance of the emitted light and extract the light having a narrow width spectrum.

The resonance wavelength in the optical resonator can be adjusted by changing the optical length L between the reflection layer 24 and the negative electrode 36. Assuming that the spectrum the light beam to be extracted out of the light originating from the organic functional layer 34 has a peak wavelength of $\lambda$, the following equation can be established. The radian $\phi$ denotes a phase shift generated when the light originating from the organic functional layer 34 is reflected at both ends of the optical resonator (for example, the reflection layer 24 and the negative electrode 36).

$$(2L)/\lambda + \phi/(2\pi) = m \text{ (where, m is any integer)}$$

Here, the optical lengths LR, LG, and LB correspond to the pixels 2R, 2G, and 2B. In the pixel 2R, the optical length LR is determined by the insulation layer 28, the first positive electrode layer 31, the second positive electrode layer 32, the third positive electrode layer 33, and organic functional layer 34 located between the reflection layer 24 and the negative electrode 36. In the pixel 2G, the optical length LG is determined by the insulation layer 28, the second positive electrode layer 32, the third positive electrode layer 33, and the organic functional layer 34. In the pixel 2B, the optical length LB is determined by the insulation layer 28, the third positive electrode layer 33, and the organic functional layer 34.

In the organic EL device 100, the optical lengths LR, LG, and LB are optimized by appropriately setting the layer thicknesses of the first positive electrode layer 31, the second positive electrode layer 32, and the third positive electrode layer 33 such that the resonance wavelength of the optical resonator in each of the display portion 6R, 6G, and 6B becomes a predetermined wavelength $\lambda$ according to the light of colors R, G, and B emitted from the pixels 2R, 2G, and 2B.

As described above, in the organic EL device 100, a portion where the layer thickness of the positive electrode 30 is different exists in any pixel 2. More specifically, in the pixel 2R, there is a portion where the layer thickness of the positive electrode 30 is the same as that of those display portion 6G and 6B in an area except for the display portion 6R. In the pixel 2G, there is a portion where the layer thickness of the positive electrode 30 is the same as that of the display portion 6B in an area except for the display portion 6G. In addition, in the pixels 2R, 2G, and 2B, the insulation layer 28 included in the optical length L does not exist in the contact portion 7.

However, in an area except for the display portion 6R, 6G, and 6B, the anti-reflection layer 26 is provided. In a portion where the anti-reflection layer 26 is provided, the light originating from the organic functional layer 34 is not reflected at the reflection layer 24, or, if reflected, a little amount of light is reflected at the anti-reflection layer 26. Therefore, in this portion, the optical resonance effect hardly exists. Therefore, in the pixel 2R, the light of the resonance wavelengths of colors G and B is hardly emitted from a portion where the layer thickness of the positive electrode 30 is the same as those of the display portion 6G and 6B. From this portion, out of the white light sent from the organic functional layer 34 to the color filter 40R side, the light hardly including light beams having the resonance wavelengths of the green and blue colors G and B is transmitted through the color filter 40R and output as the light of the red color R.

Similarly, in the pixel 2G, from the portion where the layer thickness of the positive electrode 30 is the same as that of the display portion 6B, the light beam having the resonance wavelength of the blue color B is hardly output. In addition, out of the white light sent from the organic functional layer 34, the light hardly including the light beam having the resonance wavelength of the blue color B is transmitted through the color filter 40G and output as the light of the green color G. As a result, the organic EL device 100 can display with high color purity.

Here, effects obtained by the configuration of the organic EL device 100 according to an embodiment of the invention will be described in comparison with the organic EL device of the related art. FIG. 15 is a cross-sectional diagram schematically illustrating an exemplary organic EL device of the related art as a comparison example. FIG. 15 illustrates a cross-section along the ling A-A of FIG. 3.

The organic EL device 400 shown in FIG. 15 has a similar configuration to that of the organic EL device 100 except that the anti-reflection layer 26 does not exist. Hereinafter, the organic EL device 400 will be described by focusing on a difference from the organic EL device 100 according to an embodiment of the invention. In addition, like reference numerals denote like elements as in the organic EL device 100 according to an embodiment of the invention, and descriptions thereof will be omitted.

In the organic EL device 400, the area of the pixel 2 defined by the contour of the positive electrode 30 is the area that is obtained by the luminescence of the organic EL element 8 and substantially contributes to display. Therefore, in the organic EL device 400, a portion where the layer thickness of the positive electrode 30 is different exists within the area of the pixel 2 that substantially contributes to display. In addition, in the organic EL device 400, since the anti-reflection layer 26 is not provided on the reflection layer 24, the light from the organic functional layer 34 is reflected and resonates at the optical resonator even in the portion where the layer thickness of the positive electrode 30 is different.

In the pixel 2R, a portion where the layer thickness of the positive electrode 30 is the same as those of the pixels 2G and 2B exists in the neighboring pixels 2B and 2G. Therefore, in this portion, the optical resonator includes the same optical length as the optical length LG of the pixel 2G and the optical length LB of the pixel 2B. In a portion where the optical length LG is provided, the light having the resonance wavelength of the green color G is emitted. Similarly, in a portion where the optical length LB is provided, the light having the resonance wavelength of the blue color B is emitted. However, since the light having the resonance wavelengths of the green and blue colors G and B emitted from this portion is not transmitted through the color filter 40R, it does not contribute to the display of the pixel 2R. Consequently, the luminance of the light emitted from the pixel 2R decreases.

As indicated by the arrow X of FIG. 15, when the pixel 2R is seen from the direction of inclination of the neighboring pixel 2B side, the light having the resonance wavelength of the blue color B emitted from the pixel 2B side in the pixel 2R is transmitted through the color filter 40B arranged in the pixel 2B. For this reason, a so-called color mixing is generated in which the light of the blue color B is recognized from the area of the pixel 2R where the light of the red color R is originally emitted. If the color mixing is generated, a visual characteristic is degraded when the organic EL device 400 is observed from a wide field of view.

Also in the pixel 2G, there is a portion where the optical length LB of the pixel 2B is included because the layer thickness of the positive electrode 30 is the same as that of the pixel 2B. Therefore, similar to the pixel 2R, also in the pixel 2G, the luminance of the emitted light decreases, and a color mixing is generated for the pixel 2B. Although not shown in the drawing, in the pixels 2G and 2B, since a portion where the layer thickness of the positive electrode 30 is different exists between the display portion 6 and the contact portion 7, the luminance of the emitted light also decreases also in this portion.

In this regard, for the organic EL device 100 according to an embodiment of the invention, in the pixels 2R, 2G, and 2B, the optical resonator hardly functions in a portion where the positive electrode 30 does not have the layer thickness which optimizes the optical lengths LR, LG, and LB. For this reason, the light having a resonance wavelength different from those of the colors R, G, and B hardly exists within the areas of the pixels 2R, 2G, and 2B. As a result, in comparison with the organic EL device 400 of the related art, it is possible to improve the luminance of the light emitted from the pixel 2. According to a comparison simulation between configurations of the organic EL devices 100 and 400, it is anticipated that the luminance of the organic EL device 100 can be improved, for example, 10% to 15% in comparison with the luminance of the organic EL device 400. In addition, in the organic EL device 100, it is possible to prevent a color mixing between the neighboring pixels 2 in comparison with the organic EL device 400.

Method of Manufacturing Organic EL Device

Figure 6:
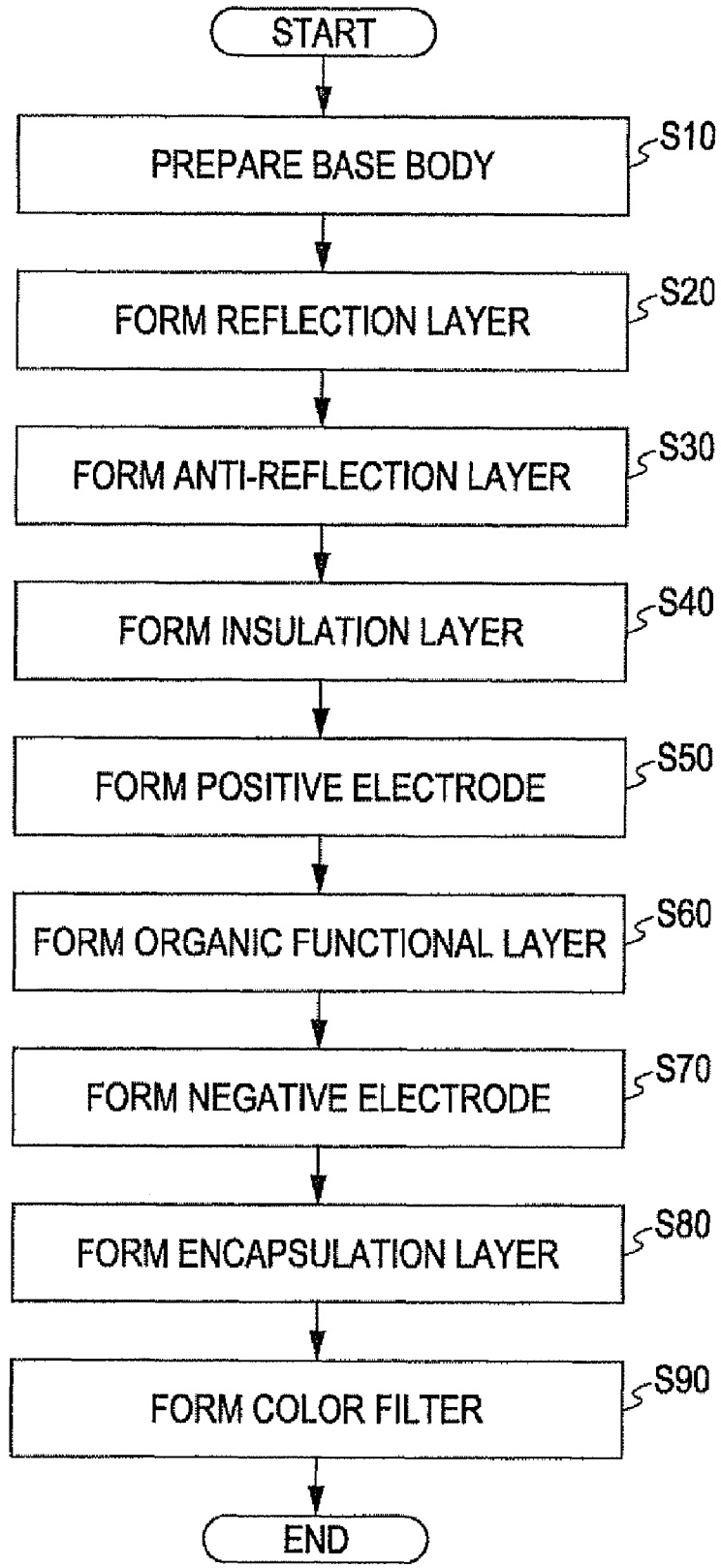
FIG. 6 is a flowchart illustrating a method of manufacturing an organic EL device according to a first embodiment of the invention.

Next, a method of manufacturing the organic EL device according to a first embodiment of the invention will be described with reference to the accompanying drawings. FIG. 6 is a flowchart illustrating a method of manufacturing the organic EL device according to a first embodiment of the invention. FIGS. 7A to 7C, 8A and 8B, 9A and 9B, and 10A and 10B illustrate a method of manufacturing the organic EL device according to a first embodiment of the invention. In addition, FIGS. 7A to 7C, 8A and 8B, 9A and 9B, and 10A and 10B illustrate cross-sections along the line A-A of FIG. 3.

Referring to FIG. 6, a method of manufacturing the organic EL device includes a process S10 of preparing the base body, a process S20 of forming the reflection layer, a process S30 of forming the anti-reflection layer, a process 840 of forming the insulation layer, a process 850 of forming the positive electrode, a process S60 of forming the organic functional layer, a process 870 of forming the negative electrode, a process 880 of forming the encapsulation layer, and a process S90 of forming the color filter.

In the process S10 of preparing the base body, the base body 20 is prepared by forming the driving TFT 12, the interlayer insulation layer 22, and the planarization layer 23 on the substrate 10 using a method of the related art. In addition, in the base body 20, a contact hole passing through the planarization layer 23 is provided in a position where the reflection layer 24 is conductively connected to the drain electrode 12d.

Next, the reflection layer 24 is formed on the base body 20 in the process S20 of forming the reflection layer, and the anti-reflection layer 26 is formed on the reflection layer 24 in the process S30 of forming the anti-reflection layer. During the process 820 of forming the reflection layer and the process 830 of forming the anti-reflection layer, the reflection layer 24 and the anti-reflection layer 26 are formed and patterned as well.

First, as shown in FIG. 7A, the reflection film 25 formed of aluminum or the like and the anti-reflection film 27 formed of TiN or the like are sequentially formed on the base body 20, for example, using a sputtering method. Although not shown in the drawing, a conductive film formed of Ti or the like is formed on the base body 20 before the reflection film 25 is formed. As a result, the conductive film, the reflection film 25, and the anti-reflection film 27 are sequentially stacked on the base body 20. As shown in FIG. 5, the reflection film 25 is conductively connected to the drain electrode 12d of the driving TFT 12 via the contact hole which passes through the planarization layer 23. A conductive film (not shown) is arranged between the drain electrode 12d and the reflection film 25.

Next, as shown in FIG. 7B, a conductive film (now shown), the reflection film 25, and the anti-reflection film 27 are patterned together, for example, using a photolithography method. As a result, the conductive layer (not shown), the reflection layer 24, and the anti-reflection layer 26 are formed in each pixel 2.

Subsequently, as shown in FIG. 7C, the opening 26a is formed in the anti-reflection layer 26, for example, using a photolithography method. The opening 26a is formed to have a different size between the pixels 2R, 2G, and 2B according to the configuration of the positive electrode 30 formed in the subsequent process S50 of forming the positive electrode 30. In the pixels 2R, 2G, and 2B, an area overlapped with the opening 26a as seen in a plan view corresponds to the display portion 6R, 6G, or 6B which substantially contributes to display.

Figure 8A:
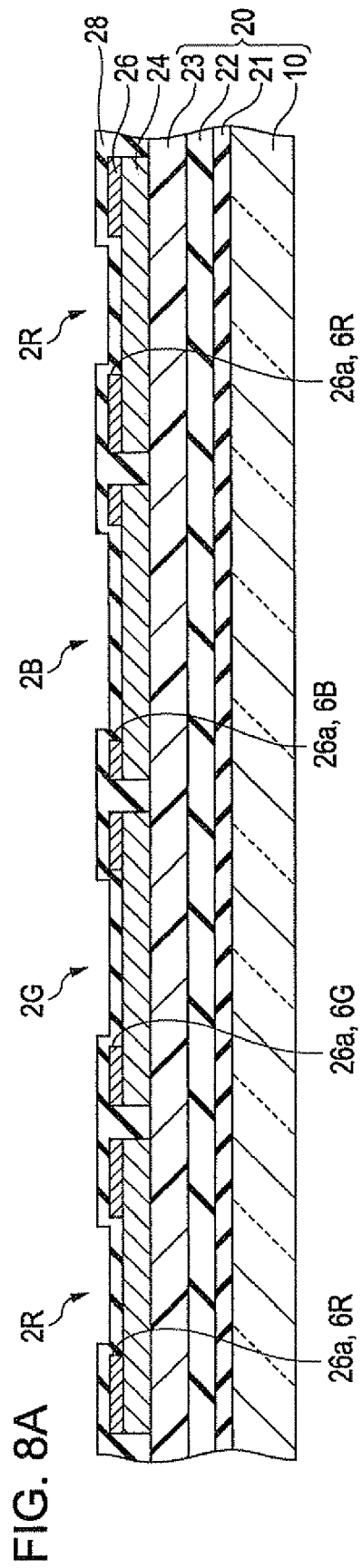
FIGS. 8A and 8B illustrate a method of manufacturing an organic EL device according to a first embodiment of the invention.

Next, in the process S40 of forming the insulation layer, as shown in FIG. 8A, the insulation layer 28 is formed to cover the base body 20, the reflection layer 24, and the anti-reflection layer 26. The insulation layer 28 is formed of SiN, for example, using a chemical vapor deposition (CVD) method. As shown in FIG. 5, the opening 28a is formed in the insulation layer 28, for example, using a photolithography method. Within the opening 28a, the anti-reflection layer 26 is exposed. As seen in a plan view, the area overlapped with the opening 28a becomes the contact portion 7.

Figure 8B:
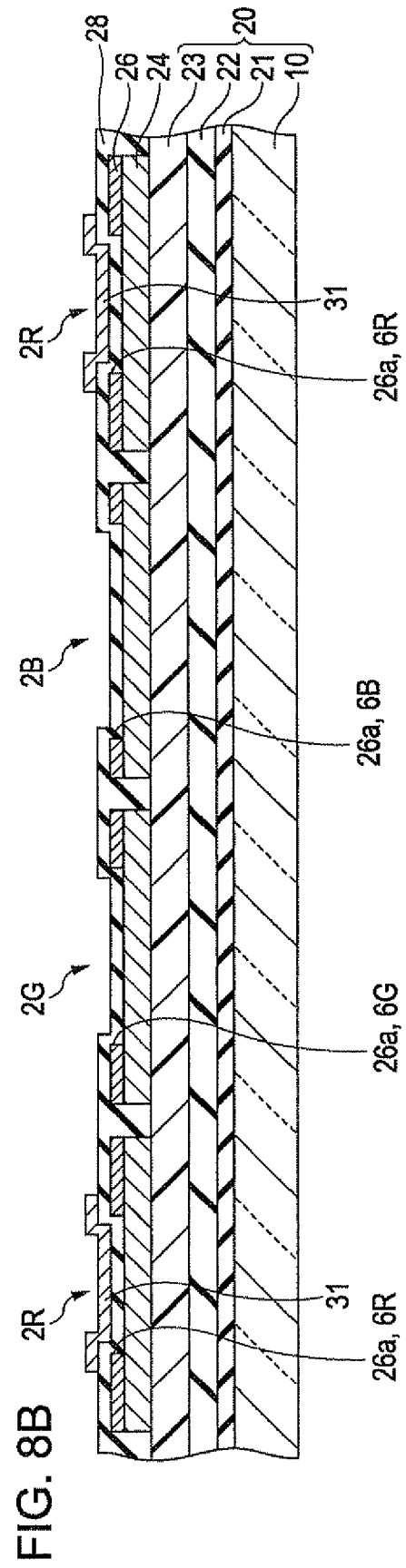

Subsequently, in the process S50 of forming the positive electrode, the first positive electrode layer 31, the second positive electrode layer 32, and the third positive electrode layer 33 are sequentially formed on the insulation layer 28. First, as shown in FIG. 8B, the first positive electrode layer 31 is formed in an area of the pixel 2R. The first positive electrode layer 31 is provided by forming the conductive film made of a polycrystalline indium-tin-oxide (ITO) to cover the insulation layer 28, for example, using a sputtering method and patterning the conductive film, for example, using a photolithography method. During the patterning, for example, a strong acid solution such as aqua regia (a mixture liquid of hydrochloric acid and acetic acid) is used as etchant. At this moment, as shown in FIG. 5, also in pixels 2G and 2B, the first positive electrode layer 31 is formed in the contact portion 7. The first positive electrode layer 31 is conductively connected to the anti-reflection layer 26 in the contact portion 7 (opening 28a).

Subsequently, as shown in FIG. 9A, the second positive electrode layer 32 is formed in the area of the pixels 2R and 2G. At this moment, also in the pixel 2B, the second positive electrode layer 32 is formed in the contact portion 7. As shown in FIG. 9B, the third positive electrode layer 33 is formed in the area of the pixels 2R, 2G, and 2B. Similar to the first positive electrode layer 31, the second positive electrode layer 32 and the third positive electrode layer 33 are formed and patterned as well.

In the pixel 2R, the positive electrode 30 formed in this way includes a stack of the first positive electrode layer 31, the second positive electrode layer 32, and the third positive electrode layer 33. In the pixel 2G, the positive electrode 30 includes a stack of the second positive electrode layer 32 and the third positive electrode layer 33. In the pixel 2B, the positive electrode 30 includes the third positive electrode layer 33. As shown in FIG. 5, for any pixel 2, in the contact portion 7, the positive electrode 30 includes a stack of the first positive electrode layer 31, the second positive electrode layer 32, and the third positive electrode layer 33.

Here, in a case where only the third positive electrode layer 33 is formed in the contact portion 7, the anti-reflection layer 26 exposed within the opening 28a is exposed by the etchant when the first positive electrode layer 31 is formed and when the second positive electrode layer 32 is formed. In a case where a strong acid solution such as aqua regia (a mixture liquid of hydrochloric acid and acetic acid) is used, since a sufficient selection ratio for the etchant between ITO and TiN is not obtained, the anti-reflection layer 26 is damaged by the etchant. According to an embodiment of the invention, since the first positive electrode layer 31, the second positive electrode layer 32, and the third positive electrode layer 33 are formed in the contact portion 7, it is possible to prevent the anti-reflection layer 26 from being exposed to the etchant.

This effect is similarly applied to the positive electrode 30. That is, the first positive electrode layer 31 is not damaged by the etchant by forming the second positive electrode layer 32 to cover the surface of the first positive electrode layer 31 when the second positive electrode layer 32 is formed. In addition, the second positive electrode layer 32 is not damaged by the etchant by forming the third positive electrode layer 33 to cover the surface of the second positive electrode layer 32 when the third positive electrode layer 33 is formed.

Subsequently, in the process S60 of forming the organic functional layer, as shown in FIG. 10A, the organic functional layer 34 is formed to cover the insulation layer 28 and the positive electrode 30. The organic functional layer 34 is formed by sequentially stacking the hole transport layer, the luminescent layer, and the electron transport layer, for example, using a vacuum evaporation method. As a result, the organic functional layer 34 is formed. In addition, an ink jet method or a spin coat method may be used to form the hole transport layer, the luminescent layer, and the electron transport layer.

Next, in the process S70 of forming the negative electrode, as shown in FIG. 10B, the negative electrode 36 made of Mg—Ag alloy is formed to cover the organic functional layer 34, for example, using a vacuum evaporation method. As a result, the organic EL element 8 is formed to have the positive electrode 30, the organic functional layer 34, and the negative electrode 36. In addition, the optical resonator is formed between the reflection layer 24 and the negative electrode 36.

Next, in the process S80 of forming the encapsulation layer, the encapsulation layer 38 is formed to cover the negative electrode 36 as shown in FIG. 4. The encapsulation layer 38 is formed of SiON or the like in an area wider than the negative electrode 36, for example, using an ion plating method.

Next, in the process 890 of forming the color filter, the color filters 40R, 40G, and 40B are formed on the encapsulation layer 38 as shown in FIG. 4. The color filters 40R, 40G, and 40B are formed by coating and patterning photosensitive resin containing pigment capable of transmitting the light beams of different colors (e.g., R, G, and B), for example, using a spin coat method. As a result, the organic EL device 100 is obtained.

Second Embodiment

Organic EL Device

Figure 11:
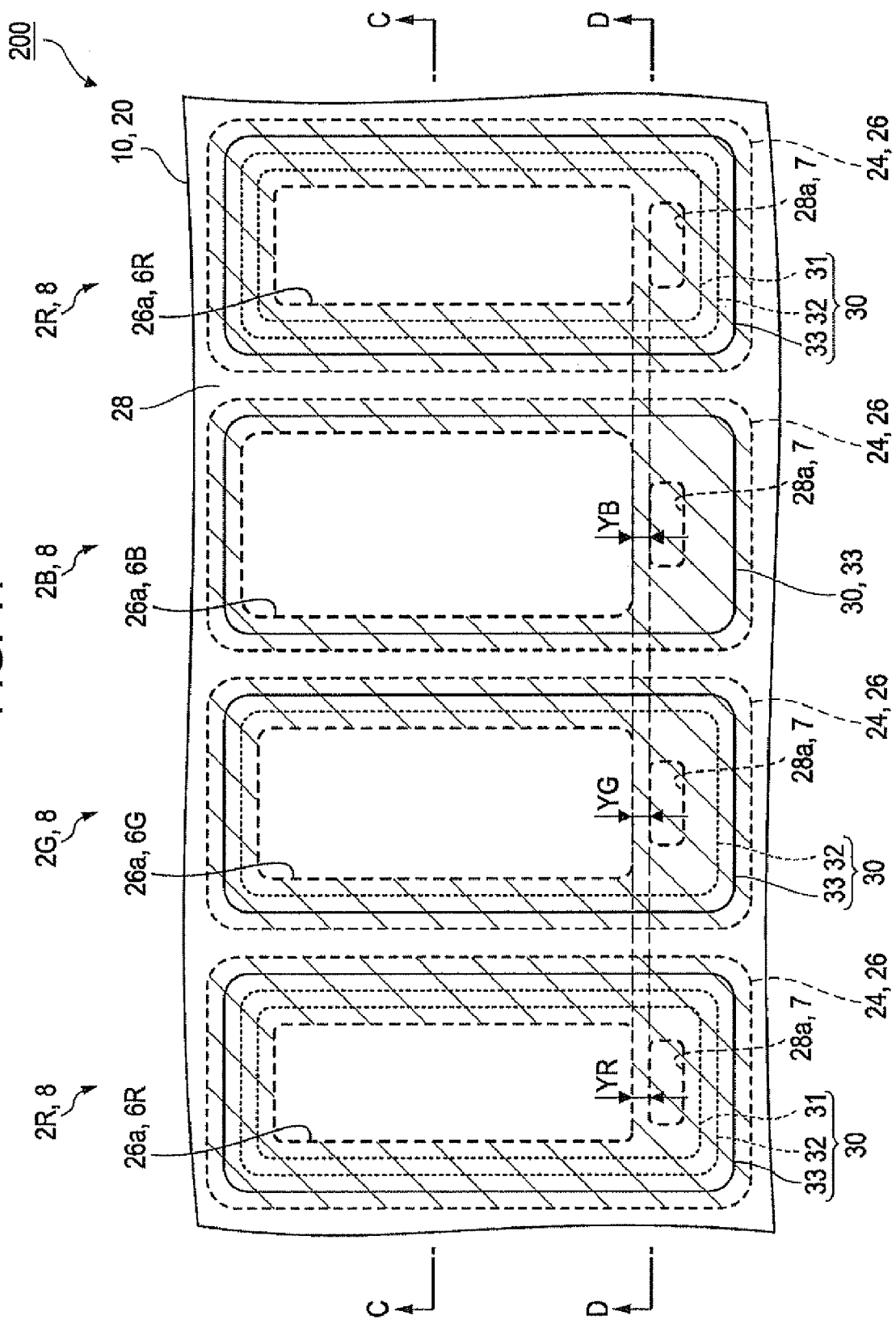
FIG. 11 is a plan view illustrating a configuration of pixels of an organic EL device according to a second embodiment of the invention.
Figure 12:
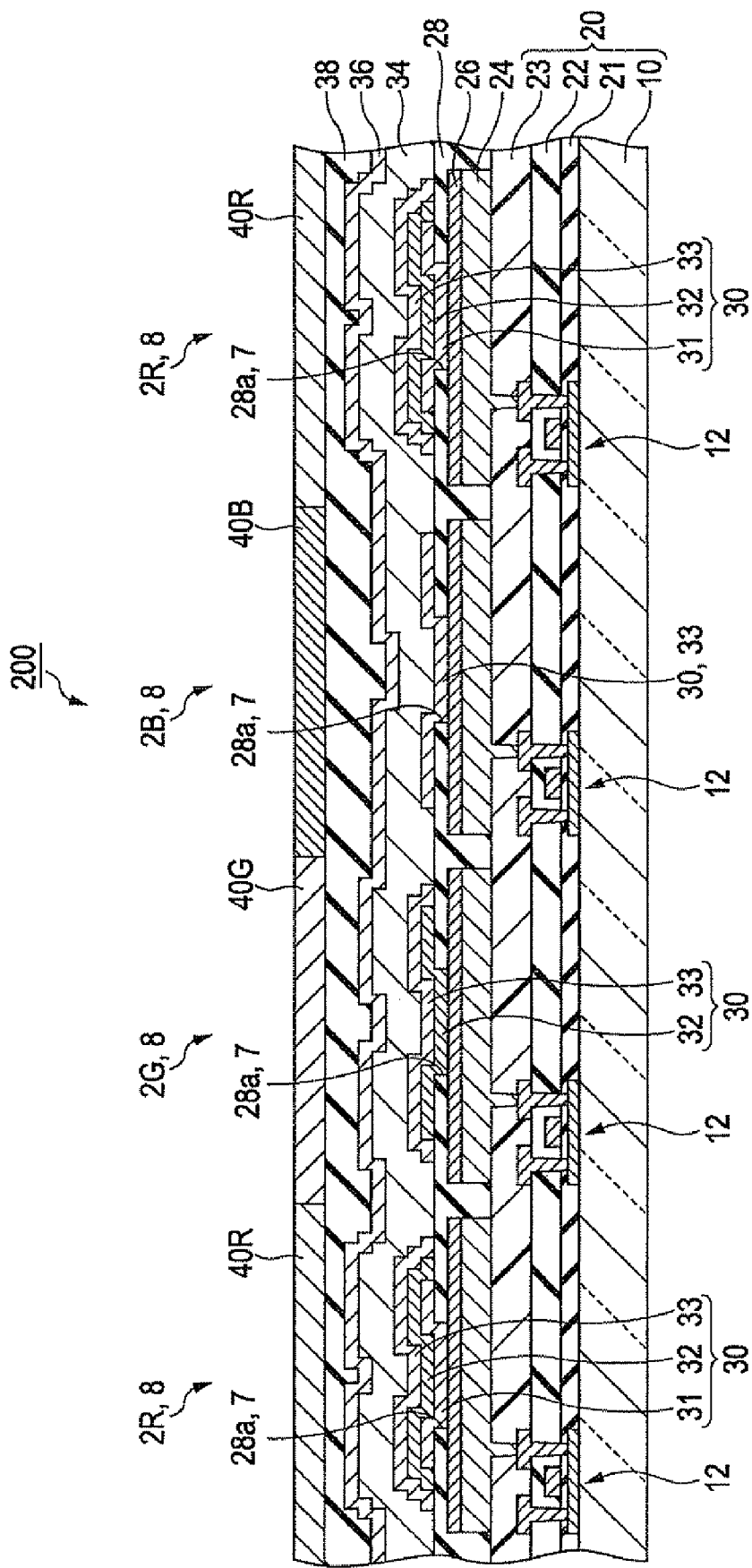
FIG. 12 is a cross-sectional view schematically illustrating a configuration of an organic EL device according to a second embodiment of the invention.

Next, the configuration of the organic EL device according to a second embodiment of the invention will be described with reference to the accompanying drawings. FIG. 11 is a plan view representing a configuration of the pixel of the organic EL device according to a second embodiment of the invention. FIG. 12 is a cross-sectional view schematically illustrating a configuration of the organic EL device according to a second embodiment of the invention. Specifically, FIG. 12 is a cross-sectional view along the line D-D of FIG. 11. In addition, since the cross-sectional view along the line A-A of FIG. 11 is commonly used in the first embodiment of the invention, a description thereof will be omitted.

The organic EL device 200 according to a second embodiment of the invention is different from the organic EL device 100 according a first embodiment of the invention in the configuration of the positive electrode 30, and other elements are similar. Like reference numerals denote like elements as in the first embodiment, and descriptions thereof will be omitted.

In the organic EL device 200 according a second embodiment of the invention, the configuration of the positive electrode 30 in the pixels 2G and 28 is different from that of the organic EL device 100 according a first embodiment of the invention as shown in FIG. 11. More specifically, in the pixel 2G, the positive electrode 30 includes the second positive electrode layer 32 and the third positive electrode layer 33. In the pixel 2B, the positive electrode 30 includes the third positive electrode layer 33.

As shown in FIG. 12, in the organic EL device 200 according to a second embodiment of the invention, the layer thickness of the positive electrode 30 in the contact portion 7 is different between the pixels 2R, 2G, and 2B. In any pixel 2, the layer thickness of the positive electrode 30 in the contact portion 7 and around the contact portion 7 is the same as the layer thickness of the positive electrode 30 in the display portion 6.

For this reason, as shown in FIG. 11, the gap YG between the display portion 6G and the contact portion 7 in the pixel 2G, the gap YB between the display portion 6B and the contact portion 7 in the pixel 2B, and the gap YR between the display portion 6R and the contact portion 7 in the pixel 2R can be equalized. As a result, it is possible to increase the areas of the display portions 6G and 6B in comparison with the organic EL device 100 according to a first embodiment of the invention. Except for the contact portion 7, the area of the display portions 6R, 6G, and 6B may increase up to the entire area where the layer thickness of the positive electrode 30 is the same.

In the organic EL device 200 according to a second embodiment of the invention, the positive electrode 30 (including the first positive electrode layer 31, the second positive electrode layer 32, and the third positive electrode layer 33) is made of amorphous ITO. For this reason, during the patterning in the process S50 of forming the positive electrode, it is possible to use an aqueous solution containing, for example, oxalate as the etchant. Therefore, since it is possible to increase the selection ratio for the etchant between the amorphous ITO and TiN (i.e., the anti-reflection layer 26), the anti-reflection layer 26 is hardly damaged by the etchant. As a result, it is possible to form the positive electrode 30 having the same layer thickness in the display portion 6 and the contact portion 7.

Also in the organic EL device 200 according to a second embodiment of the invention, since the anti-reflection layer 26 is formed in a portion where the layer thickness of the positive electrode 30 is different, similar to the organic EL device 100 according to a first embodiment of the invention, it is possible to improve the luminance of the light emitted from the pixel 2 and prevent a color mixing between the neighboring pixels 2.

Method of Manufacturing Organic EL Device

A method of manufacturing the organic EL device according to a second embodiment of the invention is different from the method of manufacturing the organic EL device according to a first embodiment of the invention in the method of forming the first positive electrode layer 31, the second positive electrode layer 32, and the third positive electrode layer 33 in the process S50 of forming the positive electrode, and other process are similar. Here, the process S50 of forming the positive electrode will be described.

In the process S50 of forming the positive electrode, first, as shown in FIG. 8B, the first positive electrode layer 31 is formed in the area of the pixel 2R (including the display portion 6R and the contact portion 7). The first positive electrode layer 31 is provided by forming a conductive film made of amorphous ITO to cover the insulation layer 28, for example, using a sputtering method and patterning the conductive film, for example, using a photolithography method. During the patterning, an aqueous solution containing, for example, oxalate is used as the etchant. For the patterning, a dry etching may be used.

Subsequently, as shown in FIG. 9A, the second positive electrode layer 32 is formed in the area of the pixels 2R and 2G (including display portions 6R and 6 G and the contact portion 7). Then, as shown in FIG. 9B, the third positive electrode layer 33 is formed in the area of the pixels 2R, 2G, and 2B (including the display portions 6R, 6G, 6B and the contact portion 7). Similar to the first positive electrode layer 31, the second positive electrode layer 32 and the third positive electrode layer 33 are formed and patterned as well. As a result, the positive electrode 30 is obtained.

Electronic Device

Figure 13:
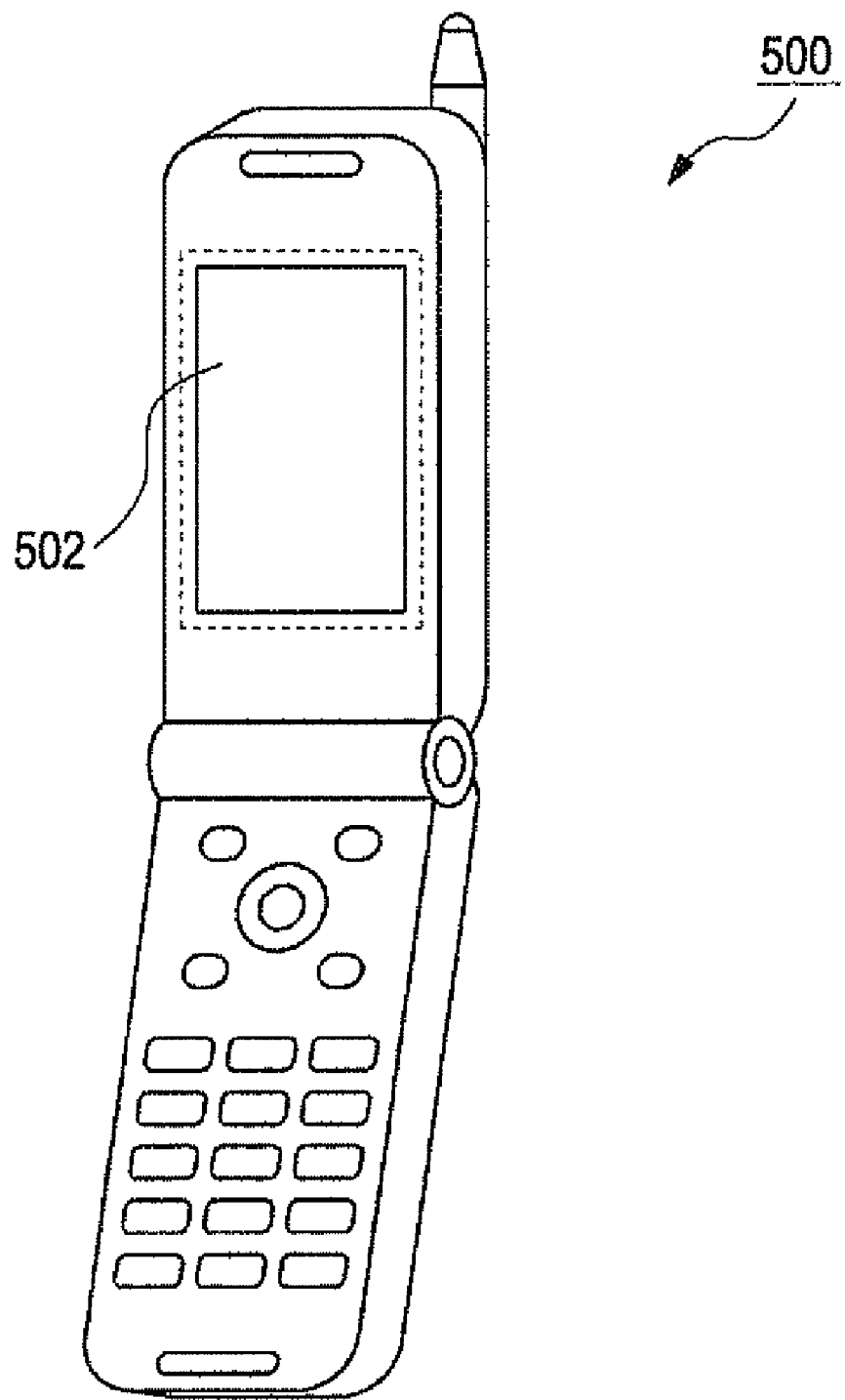
FIG. 13 illustrates a mobile phone as an electronic device.

The aforementioned organic EL devices 100 and 200 can be mounted on, for example, a mobile phone 500 as an electronic device for use as shown in FIG. 13. The mobile phone 500 includes the organic EL device 100 or 200 in the display portion 502. As a result, the mobile phone 500 including the display portion 502 can display with higher brightness than that of the related art.

In addition, the electronic device may include an electronic book, a personal computer, a digital camera, a view-finder or a monitor direct view type video tape recorder, and an in-vehicle monitor in a car navigation device.

Hereinbefore, while the embodiments of the invention have been described, various changes can be made to the aforementioned embodiments without departing from the scope of the invention. For example, the following configuration may be envisaged as a modified example.

MODIFIED EXAMPLE 1

While, in the organic EL device of the aforementioned embodiments, the reflection layer is provided in each pixel, the present invention is not limited thereto. Instead, the reflection layer may be provided commonly between a plurality of pixels in the organic EL device.

Figure 14:
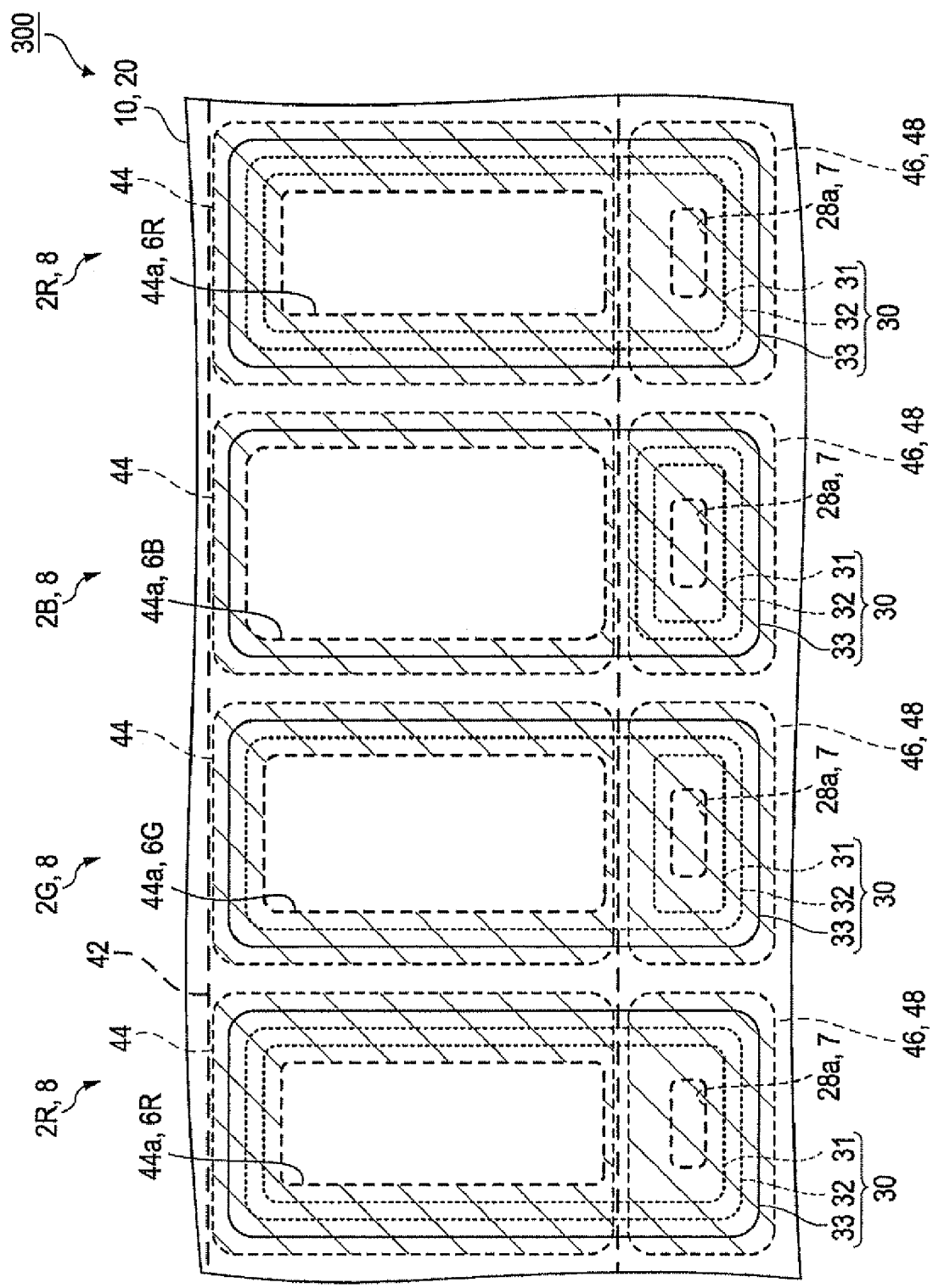
FIG. 14 is a plan view illustrating a configuration of pixels of an organic EL device according to a modified example 1.

FIG. 14 is a plan view illustrating a configuration of the pixel in the organic EL device according to a modified example 1 of the invention. The organic EL device 300 according to a modified example 1 is different from the organic EL device 100 according to the first embodiment in the configurations of the reflection layer and the anti-reflection layer, but other elements are similar. Like reference numerals denote like elements as in the first embodiment, and descriptions thereof will be omitted.

Referring to FIG. 14, the organic EL device 300 according to a modified example 1 of the invention includes a first reflection layer 42 and a second reflection layer 46 instead of the reflection layer 24 of the organic EL device 100 according to the first embodiment of the invention. The organic EL device 300 according to a modified example 1 of the invention includes a first anti-reflection layer 44 and a second anti-reflection layer 48 instead of the anti-reflection layer 26 of the organic EL device 100 according to the first embodiment of the invention.

The first reflection layer 42 is provided commonly between the pixels 2R, 2G, and 2B and extends in the breadthwise direction of the pixel 2. The first reflection layer 42 is arranged in an area overlapped with at least the display portions 6R, 6G, and 6B as seen in a plan view. For example, the first reflection layer 42 has the same electric potential as that of the negative electrode 36 with respect to the ground potential of the organic EL device 300.

The second reflection layer 46 is provided in each pixel 2. The second reflection layer 46 is arranged in at least an area overlapped with the contact portion 7 as seen in a plan view and separated from the first reflection layer 42. The second reflection layer 46 is conductively connected to a drain electrode 12d (not shown) of the driving TFT 12 in the contact portion 7.

The first anti-reflection layer 44 is provided for each pixel 2. The first anti-reflection layer 44 is arranged in an area overlapped with the first reflection layer 42 as seen in a plan view. An opening 44a is provided in the first anti-reflection layer 44. In the pixels 2R, 2G, and 2B, the area overlapped with the opening 44a as seen in a plan view corresponding to the display portions 6R, 6G, and 6B that substantially contribute to display.

The second anti-reflection layer 48 is provided for each pixel 2. The second anti-reflection layer 48 is arranged in an area overlapped with the second reflection layer 46 as seen in a plan view and separated from the first anti-reflection layer 44. The second anti-reflection layer 48 is conductively connected to the positive electrode 30 as well as the second reflection layer 46. That is, the second reflection layer 46 and the positive electrode 30 are conductively connected to each other via the second anti-reflection layer 48.

Similar to the organic EL device 100 according to the first embodiment of the invention, also in the organic EL device 300 according to the modified example 1 of the invention, it is possible to improve the luminance of the light emitted from the pixel 2 and prevent a color mixing between the neighboring pixels 2. In addition, similar to the first reflection layer 42, the first anti-reflection layer 44 may be provided commonly between the pixel 2R, 2G, and 2B. In addition, the organic EL device 300 may not include the second reflection layer 46 and the second anti-reflection layer 48. In addition, the positive electrode 30 may be conductively connected to the drain electrode 12d.

MODIFIED EXAMPLE 2

While, in the organic EL device according to the aforementioned embodiments, the light beams of three colors R, G, and B are emitted from the pixel 2, the present invention is not limited thereto. Instead, the organic EL device may be configured to emit light beams of two different colors from the pixel 2 or light beams of different colors such as white or cyan in addition to the three colors R, G, and B. Also in such a configuration, it is possible to obtain the same effects as those of the organic EL device according to the aforementioned embodiments.

MODIFIED EXAMPLE 3

While the organic EL device according to the aforementioned embodiments has a color filter 40, the present invention is not limited thereto. Instead, the organic EL device may not include the color filter 40. If the organic EL device has the optical resonator, similar to the organic EL device according the aforementioned embodiments, since the reflection at the reflection layer 24 is suppressed in other portions than the opening 26a (i.e., the display portions 6R, 6G, and 6B) of the anti-reflection layer 26, the optical resonator is not provided in a portion where the layer thickness of the positive electrode 30 is different. Therefore, it is possible to improve the luminance of the light emitted from the pixel 2. However, since white light is emitted from other portions than the opening 26a of the anti-reflection layer 26, the color purity of the light emitted from the pixel 2 is probably degraded. In addition, since the color filter 40 is not provided, a color mixing between pixels is not generated.

MODIFIED EXAMPLE 4

While, in the organic EL device according to the aforementioned embodiments, white light is emitted from the organic EL element 8, the present invention is not limited thereto. Instead, the organic EL device may include an organic functional layer capable of emitting light of a different color such as R, G, and B corresponding to the pixels 2R, 2G, and 2B. Also in such a configuration, since the optical resonator is not provided in a portion where the layer thickness of the positive electrode 30 is different, it is possible to improve the luminance of the light emitted from the pixel 2.

MODIFIED EXAMPLE 5

While, in the organic EL device according to the aforementioned embodiments, the pixel 2 having a generally rectangular shape are arranged in a matrix shape as seen in a plan view, the present invention is not limited thereto. Instead, the pixel 2 may have a different shape such as a circular or elliptical shape as seen in a plan view. In addition, the pixels may be arranged in a hound's-tooth shape.

The entire disclosure of Japanese Patent expressly incorporated by reference herein.

What is claimed is:

1. An organic electroluminescent (EL) device comprising a base body;
pixels that are arranged in the base body and emit light beams having either of at least two different colors;
an reflection layer that has optical reflectivity and is arranged on the base body;
an anti-reflection layer that is arranged on the reflection layer and has optical reflectivity lower than that of the reflection layer;
an insulation layer that is arranged on the anti-reflection layer and has optical transmittance;
a first electrode that is arranged in each pixel on the insulation layer and has optical transmittance;
an organic functional layer that is arranged on the first electrode and includes at least a luminescent layer;
a second electrode that is arranged on the organic functional layer and has optical reflectivity and optical transmittance; and
an optical resonator that is formed between the reflection layer and the second electrode to resonate the light from the organic functional layer,
wherein the optical resonator has a resonance wavelength corresponding to a color of the light emitted from the pixels in a first area out of an area of the pixels, and
the anti-reflection layer is provided in an area except for the first area out of the area of the pixels.

2. The organic EL device according to claim 1, wherein the layer thickness of the first electrode is different in each pixel depending on the color of the light emitted from the pixel and is the same at least in the first area.

3. The organic EL device according to claim 2, further including a driving element provided in each pixel on the base body,
wherein first electrode is conductively connected to the driving element in a second area different from the first area out of the area of the pixels, and
the layer thickness of the first electrode in the second area is the same as the layer thickness of the first electrode in the first area.

4. The organic EL device according to claim 1, wherein the reflection layer is arranged in each pixel.

5. The organic EL device according to claim 1, further including a color filter that is arranged in each pixel on the second electrode and corresponds to the color of the light emitted from the pixel.

6. The organic EL device according to claim 1, wherein the at least two different colors include red, green, or blue.

7. An electronic device comprising the organic EL device according to claim 1.

8. A method of manufacturing an organic EL device having pixels that are arranged on a base body and emit light beams having either of at least two different colors,
a reflection layer having optical reflectivity,
a first electrode having optical transmittance,
a second electrode having optical reflectivity and optical transmittance,
an organic functional layer that is interposed between the first and second electrodes and includes at least a luminescent layer, and
an optical resonator that is formed between the reflection layer and the second electrode to resonate the light from the organic functional layer,
the method comprising:
forming the reflection layer on the base body;
forming, on the reflection layer, an anti-reflection layer having optical reflectivity lower than that of the reflection layer;
forming, on the anti-reflection layer, an insulation layer having optical transmittance;
forming the first electrode in each pixel on the insulation layer;
forming the organic functional layer on the first electrode; and
forming the second electrode on the organic functional layer,
wherein, in the process of forming the anti-reflection layer, the anti-reflection layer is formed in an area except for the first area out of the area of the pixels, and
wherein, in the process of forming the first electrode, the first electrode is formed to have a different layer thickness in each pixel depending on a color of the light emitted from the pixel and at the same time have the same layer thickness at least in the first area.

9. The method according to claim 8, wherein the base body further includes a driving element provided in each pixel, and
wherein, in the process of forming the first electrode, the first electrode is conductively connected to the driving element in a second area different from the first area out of the area of the pixels, and
the layer thickness of the first electrode in the second area is the same as the layer thickness of the first electrode in the first area.

10. The method according to claim 8, wherein, in the process of forming the reflection layer, the reflection layer is formed in each pixel.

11. The method according to claim 8, further including forming, on the second electrode, a color filter corresponding to the color of the light emitted from the pixel after forming the second electrode.

12. The method according to claim 8, wherein at least the two different colors include red, green, or blue.

* * * * *